United States Patent [19]

Shirai et al.

[11] Patent Number: 4,557,987
[45] Date of Patent: Dec. 10, 1985

[54] PHOTOCONDUCTIVE MEMBER HAVING BARRIER LAYER AND AMORPHOUS SILICON CHARGE GENERATION AND CHARGE TRANSPORT LAYERS

[75] Inventors: Shigeru Shirai, Yamato; Junichiro Kanbe, Yokohama; Tadaji Fukuda, Kawasaki, all of Japan

[73] Assignee: Canon Kabushiki Kaisha, Tokyo, Japan

[21] Appl. No.: 328,499

[22] Filed: Dec. 8, 1981

[30] Foreign Application Priority Data

Dec. 23, 1980 [JP] Japan .................................. 55-183130
Dec. 23, 1980 [JP] Japan .................................. 55-183131

[51] Int. Cl.⁴ ........................ G03G 5/082; H01L 45/00
[52] U.S. Cl. ................................................ 430/58; 430/57; 430/65; 430/66; 430/67; 357/2; 357/30

[58] Field of Search .......................... 250/211 R, 211 J; 357/2, 30; 430/57, 65, 84, 58, 66, 67; 427/74; 252/501.1

[56] References Cited

U.S. PATENT DOCUMENTS 4,226,643 10/1980 Carlson .............................. 357/2 X
4,330,182 5/1982 Coleman ............................ 430/57 X Primary Examiner—Edward P. Westin
Attorney, Agent, or Firm—Fitzpatrick, Cella, Harper & Scinto

[57] ABSTRACT

A photoconductive member having a support, amorphous charge generation and charge transport layers and a barrier layer between the support and the charge generation layer. The charge generation layer contains from 0.1 to 10 atomic percent of a conduction controlling impurity. Intermediate and surface barrier layers are also employed and additional transport layers are utilized.

79 Claims, 10 Drawing Figures

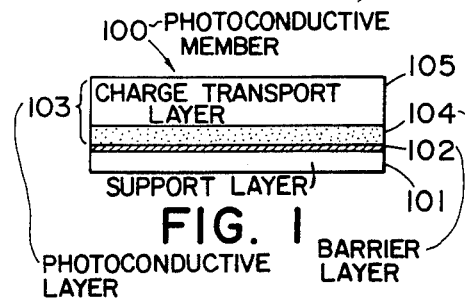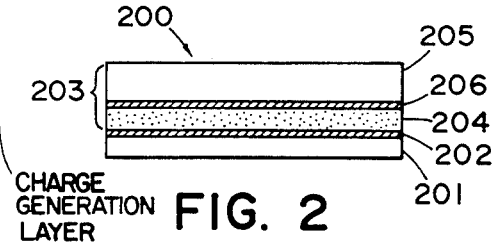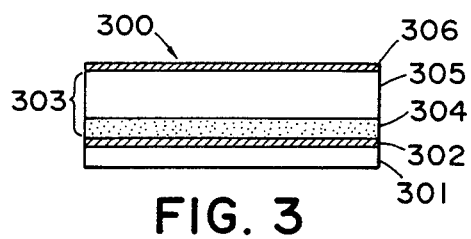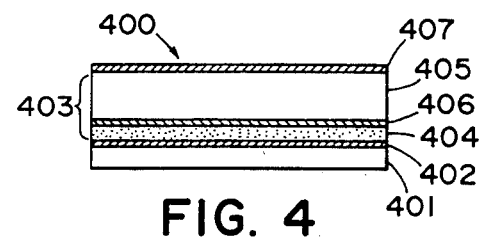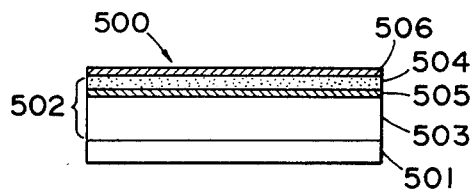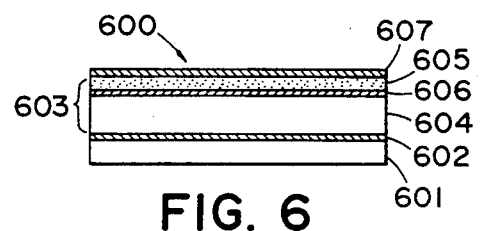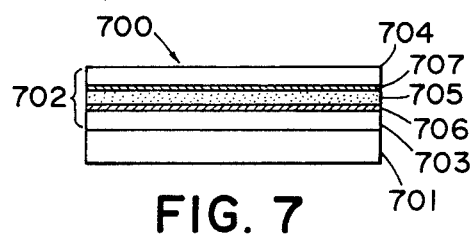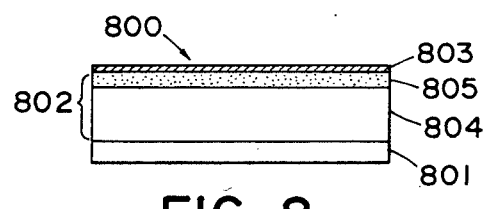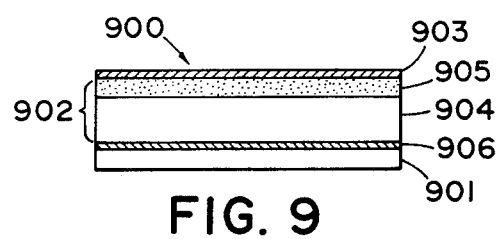

PHOTOCONDUCTIVE MEMBER HAVING BARRIER LAYER AND AMORPHOUS SILICON CHARGE GENERATION AND CHARGE TRANSPORT LAYERS

BACKGROUND OF THE INVENTION

1. Field of the Invention

This invention relates to a photoconductive member having a sensitivity to electromagnetic waves such as light [herein used in a broad sense, including ultraviolet rays, visible light, infrared rays, X-rays and gamma-rays].

2. Description of the Prior Arts

Photoconductive materials, which constitute image-forming members for electrophotography in solid state image pickup devices or in the field of image formation, or photoconductive layers in manuscript reading devices, are required to have a high sensitivity, a high SN ratio [Photocurrent($I_p$)/Dark current ($I_d$)], spectral characteristics matching to those of electromagnetic waves to be irradiated, spectral characteristics matching to wavelength characteristics of light emitted from semiconductor lasers which have recently been particularly developed with a remarkable progress, a rapid response to light, a desired dark resistance value as well as no harm to human bodies during usage. Further, in a solid state image pickup device, it is also required that the residual image should easily be treated within a predetermined time. In particular, in case of an image-forming member for electrophotography to be assembled in an electrophotographic device to be used in an office as office apparatus, the aforesaid harmless characteristic is very important.

From the standpoint as mentioned above, amorphous silicon [hereinafter referred to as a-Si] has recently attracted attention as a photoconductive material. For example, German Laid-open Patent application Nos. 2746967 and 2855718 disclose applications of a-Si for use in image-forming members for electrophotography, and German Laid-open Patent application No. 2933411 an application of a-Si for use in a photoelectric conversion reading device.

However, the photoconductive members having photoconductive layers constituted of the a-Si of prior art have various electrical, optical and photoconductive characteristics such as dark resistance value, photosensitivity and light response as well as environmental characteristics and aging stability in use such as humidity resistance, which should further be improved. Thus, in a practical solid state image pickup device, reading device or an image-forming member for electrophotography, they cannot effectively be used also in view of their productivity and possibility of their mass production.

For instance, when applied in an image-forming member for electrophotography, residual potential is frequently observed to remain during use thereof. When such a photoconductive member is repeatedly used for a long time, there will be caused various inconveniences such as accumulation of fatigues by repeated uses or so called ghost phenomenon wherein residual images are formed.

Further, according to the experience by the present inventors from a number of experiments, a-Si material constituting the photoconductive layer of an image-forming member for electrophotography, while it has a number of advantages, as compared with Se, CdS ZnO or OPC (organic photoconductive materials) such as PVCz or TNF of prior art, is also found to have several problems to be solved. Namely, when charging treatment is applied for formation of electrostatic images on the photoconductive layer of an image-forming member for electrophotography having a photoconductive member constituted of a mono-layer of a-Si which has been endowed with characteristics for use in a solar battery of prior art, dark decay is markedly rapid, whereby it is difficult to apply a conventional photographic method. This tendency is further pronounced under a humid atmosphere to such extent in some cases that no charge is retained at all before development.

Further, the photoconductive members of the prior art exhibit a relatively smaller absorption coefficient in the region of wavelength longer than the long wavelength region as compared with that in short wavelength region of visible light. This means that there is room left to be improved in matching with semiconductor lasers.

Thus, it is required in the designing of a photoconductive material to make efforts to obtain desirable electrical, optical, and photoconductive characteristics along with the improvement of a-Si materials per se.

In view of the above points, the present invention has been obtained as a result of extensive studies made comprehensively from the standpoints of applicability and utility of a-Si as a photoconductive member for image-forming members for electrophotography, solid state image pickup devices or reading devices. It has now been found that a photoconductive member elaborated to have a specific layer structure comprising a photoconductive layer constituted of a so-called hydrogenated amorphous silicon, a halogenated amorphous silicon or a halogen-containing hydrogenated amorphous silicon [hereinafter referred comprehensively as a-Si(H, X)], which is an amorphous material containing at least one of hydrogen atom(H) or halogen atom(X) in a matrix of silicon, and a specific barrier layer interposed between said photoconductive layer and a support which supports said photoconductive layer, is not only practically useful but also has characteristics superior in substantially all respects to those of the photoconductive members of prior arts, especially markedly excellent characteristics as a photoconductive member for electrophotography as well as excellent absorption spectral characteristics in the region of longer wavelengths. The present invention is based on this finding.

SUMMARY OF THE INVENTION

The primary object of the present invention is to provide a photoconductive member having constantly stable electrical, optical and photoconductive characteristics, which is an all-environment type substantially without limitations with respect to the environment under which it is used, being excellent in photosensitive characteristic in the region of longer wavelengths and also markedly excellent in light-resistant fatigue without deterioration after repeated uses and free entirely or substantially from residual potentials observed.

Another object of the present invention is to provide a photoconductive member, having a high photosensitivity, over the whole region of visible light, being excellent in matching with semiconductor laser and having also a rapid response to light.

Still another object of the present invention is to provide a photoconductive member, which is sufficiently capable of retaining charges at the time of charging treatment for formation of electrostatic images to the extent such that a conventional electrophotographic method can be applied when it is provided for use as an image-forming member for electrophotography, and which has excellent electrophotographic characteristics of which substantially no deterioration is observed even under a highly humid atmosphere.

Further, still another object of the present invention is to provide a photoconductive member for electrophotography capable of providing easily a high quality image which is high in density, clear in halftone and high in resolution.

According to one aspect of the present invention, there is provided a photoconductive member, comprising a support for a photoconductive member; a charge generation layer which generates photocarriers movable by irradiation of an electromagnetic wave; a charge transport layer which is disposed in relation to said charge generation layer so as to permit efficient injection of photocarriers generated in said charge generation layer into the charge transport layer and is provided with the function to transport effectively the said injected photocarriers; and a first barrier layer interposed between said support and said charge generation layer; said charge generation layer and said charge transport layer being each constituted of an amorphous material containing at least one of hydrogen and halogen atoms in a matrix of silicon atoms, and said charge generation layer containing an impurity which controls the conduction type in an amount of $1 \times 10^{-1}$ to 10 atomic %.

According to another aspect of the present invention, there is provided a photoconductive member, comprising a support for a photoconductive member; a surface barrier layer provided with the function to bar injection of the surface charges from the side of the free surface, which is layered on said support; a charge generation layer for generation of photocarriers movable by irradiation of an electromagnetic wave, which is provided in contact with said barrier layer; and a charge transport layer which is provided in contact with said charge generation layer so that the photocarriers generated in said charge generation layer may efficiently be injected into the charge transport layer, said charge generation layer and said charge transport layer being each constituted of an amorphous material containing at least one of hydrogen and halogen atoms in a matrix of silicon atoms, and said charge generation layer containing an impurity which controls the conduction type in an amount of $1 \times 10^{-1}$ to atomic %.

BRIEF DESCRIPTION OF THE DRAWING

In the drawing,

FIGS. 1 to 9 show schematic sectional views for illustration of the layer structures of the photoconductive members according to the present invention, respectively.

DETAILED DESCRIPTION OF THE INVENTIONS

Figure 10:
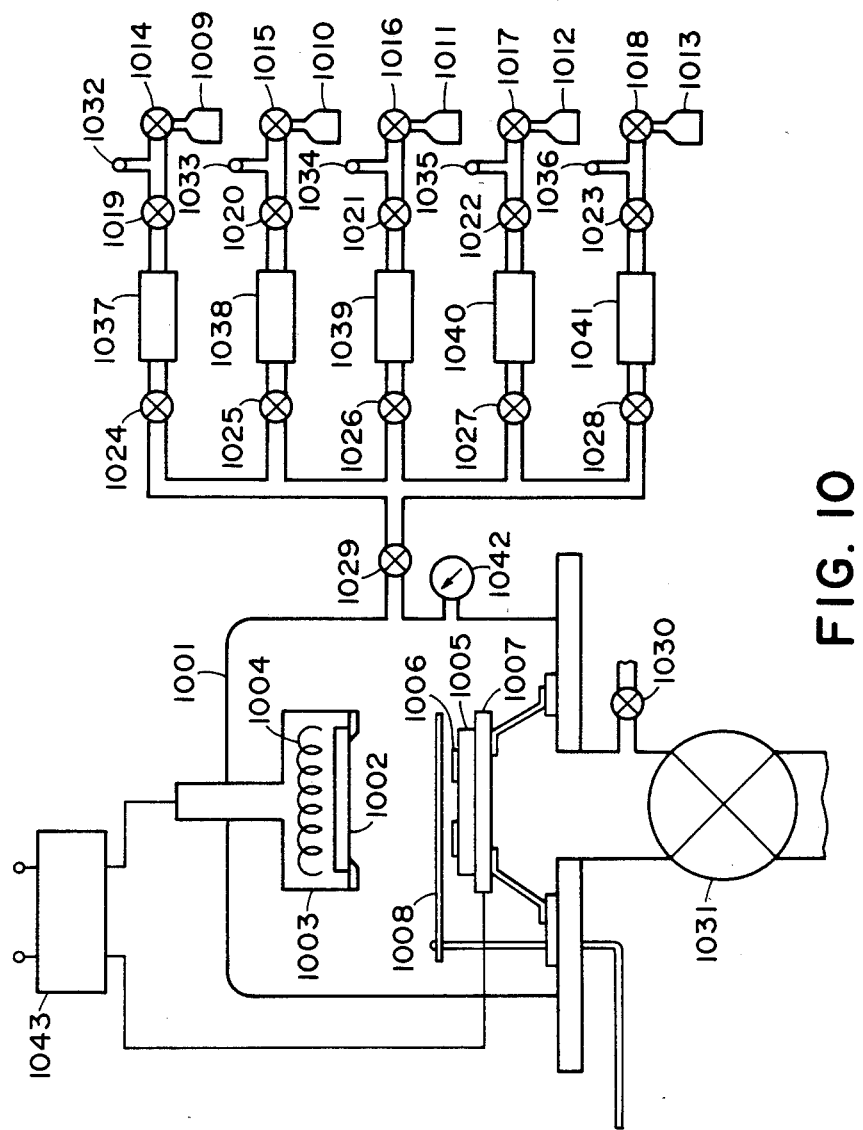
FIG. 10, a schematic flow chart for illustration of one embodiment of the device for preparation of the photoconductive members according to the present invention.

Referring now to the drawing, the photoconductive members according to the present invention are to be described in detail below.

FIG. 1 shows a schematic sectional view for illustration of the basic embodiment of the photoconductive member of this invention.

The photoconductive member 100 as shown in FIG. 1 is one of the most basic embodiment, having a layer structure comprising a support 101 for photoconductive member, a first barrier layer 102 provided on said support, and a photoconductive layer 103 provided in direct contact with said barrier layer 102, said photoconductive layer having a structure separated in function, consisting of a charge generation layer 104 and a charge transport layer 105.

The support 101 may be either electroconductive or insulating. As the electroconductive material, there may be mentioned metals such as NiCr, stainless stell, Al, Cr, Mo, Au, Nb, Ta, V, Ti, Pt, Pd, etc. or alloys thereof.

As insulating supports, there may conventionally be used films or sheets of synthetic resins, including polyesters, polyethylene, polycarbonates, cellulose acetate, polypropylene, polyvinyl chloride, polyvinylidene chloride, polystyrene, polyamides, etc., glasses, ceramics, papers and the like. These insulating supports may suitably have at least one surface subjected to electroconductive treatment, and it is desirable to provide other layers on the side at which said electroconductive treatment has been applied.

For example, electroconductive treatment of a glass can be effected by providing a thin film of NiCr, Al, Cr, Mo, Au, Ir, Nb, Ta, V, Ti, Pt, Pd, $In_2O_3$, $SnO_2$, ITO($In_2O_3+SnO_2$), etc. thereon. Alternatively, a synthetic resin film such as polyester film can be subjected to the electroconductive treatment on its surface by vacuum vapor deposition, electron-beam deposition or sputtering of a metal such as NiCr, Al, Ag, Pb, Zn, Ni, Au, Cr, Mo, Ir, Nb, Ta, V, Ti, Pt, etc. or by laminating treatment with said metal, thereby imparting electroconductivity to the surface. The support may be shaped in any form such as cylinders, belts, plates or others, and its form may be determined as desired. For example, when the photoconductive member 100 in FIG. 1 is to be used as an image-forming member for electrophotography, it may desirably be formed into an endless belt or a cylinder for use in continuous high speed copying. The support may have a thickness, which is conveniently determined so that a photoconductive member as desired may be formed. When the photoconductive member is required to have a flexibility, the support is made as thin as possible, so far as the function of a support can be exhibited. However, in such case, the thickness is generally 10μ or more from the points of fabrication and handling of the support as well as its mechanical strength.

The barrier layer 102 has the function of barring effectively the flow of free carriers in the direction of from the side of the support 101 to the side of the charge generation layer 104 or in the direction of from the side of the charge generation layer 104 to the side of the support 101 and permitting easily the photocarriers generated by irradiation of electromagnetic waves in the charge generation layer 104 and migrating toward the support 101 to pass therethrough from the side of the charge generation layer 104 to the side of the support 101.

The barrier layer 102 is constituted of an amorphous material of a matrix of silicon atoms, containing at least one selected from carbon atom, nitrogen atom and oxygen atom, further containing, if necessary, at least one of hydrogen atom and halogen atom [these are represented comprehensively by a-[Si$x$ (C, N, O)$_{1-x}$]$_y$(H, X)$_{1-y}$ (where $0<x<1$, $0<y<1$); or an electrically insulating metal oxide.

In the present invention, as halogen atom(X), F, Cl, Br, I, especially F and Cl are preferred.

Typical examples of the amorphous materials effectively used in the present invention for constitution of the above barrier layer 102 may include carbon type amorphous materials as exemplified by a-Si$_a$C$_{1-a}$, a-(Si$_b$C$_{1-b}$)$_c$H$_{1-c}$, a-(Si$_d$C$_{1-d}$)$_e$X$_{1-e}$, a-(Si$_f$C$_{1-f}$)$_g$(H+X)$_{1-g}$; nitrogen type amorphous materials as exemplified by a-Si$_h$N$_{1-h}$, a-(Si$_i$N$_{1-i}$)$_j$H$_{1-j}$, a-(Si$_k$N$_{1-k}$)$_l$X$_{1-l}$, a-(Si$_m$N$_{1-m}$)$_n$(H+X)$_{1-n}$; oxygen type amorphous materials as exemplified by a-Si$_o$O$_{1-o}$, a-(Si$_p$O$_{1-p}$)$_q$H$_{1-q}$, a-(Si$_r$O$_{1-r}$)$_s$X$_{1-s}$, a-(Si$_t$O$_{1-t}$)$_u$(H+X)$_{1-u}$; and further amorphous materials containing at least two kinds of atoms of carbon atom (C), nitrogen atom (N) and oxygen atom (O) as constituent atoms in the above amorphous materials (wherein $0<a, b, c, d, e, f, g, h, i, j, k, l, m, n, o, p, q, r, s, t, u<1$).

These amorphous materials are chosen optimally depending on the characteristics required for the barrier layer 102 by the optimum design of the layer construction and the easiness in continuous preparation of the charge generation layer 104 and the charge transport layer 105 which are layered on said barrier layer 102. In particular, from the aspect of characteristics, it is preferred to choose a carbon type or nitrogen type amorphous material.

The barrier layer 102 constituted of the above amorphous material may be formed by the glow discharge method, the sputtering method, the ion implantation method, the ion plating method, the electron-beam method or the like. These production methods are suitably selected depending on the factors such as production conditions, the degree of loading of installation capital investment, production scale, the desirable characteristics of the photoconductive members to be prepared, etc.

But the glow discharge method or the sputtering method may preferably be adopted for the advantages of easy control of the conditions for preparation of a photoconductive member having desirable characteristics as well as easy incorporation of other necessary atoms such as carbon atom (C), nitrogen atom(N), oxygen atom(O), hydrogen atom(H), and halogen atom(X) together with silicon atoms into the barrier layer 102 prepared.

Further, in the present invention, the glow discharge method and the sputtering method may be employed in combination in the same device system to form the barrier layer 102.

For formation of the barrier layer 102 according to the glow discharge method, the starting gases for formation of the aforesaid amorphous material, which may be admixed, if necessary, with a diluting gas at a desired mixing ratio, are introduced into a chamber for vacuum deposition in which the support 101 is placed, and the gas introduced is converted to a gas plasma by excitation of glow discharge in the chamber thereby to deposit the aforesaid amorphous material on the support 101.

In the present invention, the substances effectively used as the starting materials for formation of the barrier layer 102 constituted of a carbon type amorphous material may include silicon hydride gases constituted of silicon atom(Si) and hydrogen atom(H) such as silanes, as exemplified by SiH$_4$, Si$_2$H$_6$, Si$_3$H$_8$, Si$_4$H$_{10}$, etc., hydrocarbons constituted of carbon atom(C) and hydrogen atom(H) such as saturated hydrocarbons having 1 to 5 carbon atoms, ethylenic hydrocarbons having 2 to 5 carbon atoms or acetylenic hydrocarbons having 2 to 4 carbon atoms.

More specifically, typical examples are saturated hydrocarbons such as methane(CH$_4$), ethane(C$_2$H$_6$), propane(C$_3$H$_8$), n-butane(n-C$_4$H$_{10}$), pentane(C$_5$H$_{12}$) and the like; ethylenic hydrocarbons such as ethylene(C$_2$H$_4$), propylene(C$_3$H$_6$), butene-1 (C$_4$H$_8$), butene-2(C$_4$H$_8$), isobutylene(C$_4$H$_8$), pentene(C$_5$H$_{10}$) and the like; and acetylenic hydrocarbons such as acetylene (C$_2$H$_2$), methylacetylene(C$_3$H$_4$), butyne(C$_4$H$_6$) and the like.

Typical examples of the starting gas having silicon atom(Si), carbon atom(C) and hydrogen atom(H) as constituent atoms are alkyl silanes such as Si(CH$_3$)$_4$, Si(C$_2$H$_5$)$_4$ and the like. In addition to these starting gases, H$_2$ can, of course, be effectively used as the starting gas for introduction of hydrogen atom(H).

The starting gases for incorporation of halogen atoms (X) for constitution of the barrier layer 102 with a carbon type amorphous material containing halogen atoms(X) may include single substances of halogens, hydrogen halides, interhalogen compounds, silicon halides, halogen-substituted silicon hydrides, etc.

More specifically, there may be included single substances of halogens such as halogenic gases of fluorine, chlorine, bromine and iodine; hydrogen halides such as HF, HI, HCl, HBr, etc.; interhalogen compounds such as BrF, ClF, ClF$_3$, ClF$_5$, BrF$_5$, BrF$_3$, IF$_7$, IF$_5$, ICl, IBr, etc.; silicon halides such as SiF$_4$, Si$_2$F$_6$, SiCl$_4$, SiCl$_3$Br, SiCl$_2$Br$_2$, SiClBr$_3$, SiCl$_3$I, SiBr$_4$, etc.; halogen-substituted silanes such as SiH$_2$F$_2$, SiH$_2$Cl$_2$, SiHCl$_3$, SiH$_3$Cl, SiH$_3$Br, SiH$_2$Br$_2$, SiHBr$_3$.

In addition to those mentioned above, as the starting materials useful for formation of the barrier layer, there are halogen-substituted paraffinic hydrocarbons such as CCl$_4$, CHF$_3$, CH$_2$F$_2$, CH$_3$F, CH$_3$Cl, CH$_3$Br, CH$_3$I, C$_2$H$_5$Cl etc.; fluorinated sulfur compounds such as SF$_4$, SF$_6$, etc.; and halogen containing alkyl silanes such as SiCl(CH$_3$)$_3$, SiCl$_2$(CH$_3$)$_2$, SiCl$_3$CH$_3$ etc.

These substances for forming a barrier layer are chosen as desired and used in formation of a barrier layer so that silicon atom, carbon atom and, if necessary, halogen atom or hydrogen atom may be contained at a desirable composition ratio in the barrier layer formed.

For example, Si(CH$_3$)$_4$, which can easily accomplish incorporation of silicon atom, carbon atom and hydrogen atom and form a barrier layer with desirable characteristics, and SiHCl$_3$, SiCl$_4$, SiH$_2$Cl$_2$ or SiH$_3$Cl, as a substance for incorporation of halogen atom, may be introduced at a predetermined mixing ratio in a gaseous state into a device for formation of a barrier layer, in which glow discharge is excited to form the barrier layer constituted of a-(Si$_f$C$_{1-f}$)$_g$ (X+H)$_{1-g}$.

In the present invention, when the glow discharge method is adopted for constituting the barrier layer 102 with a nitrogen type amorphous material, desired substances selected from those mentioned above for formation of barrier layer may be used in combination with a starting gas for introduction of nitrogen atom.

As the starting materials for introduction of nitrogen atom, there may be mentioned, gaseous or gasifiable nitrogen compounds constituted of nitrogen atom(N) or nitrogen atom(N) and hydrogen atom(H) such as nitrogen, nitrides, azides, and the like, including for example, nitrogen($N_2$), ammonia ($NH_3$), hydrazine ($H_2NNH_2$), hydrogen azide($HN_3$) ammonium azide($NH_4N_3$), and so on. In addition, it is also possible to use a nitrogen halide compound which can incorporate nitrogen atom and halogen atom, such as nitrogen trifluoride ($F_3N$), nitrogen tetrafluoride($F_4N_2$), and the like.

When the glow discharge method is adopted for constituting the barrier layer 102 with an oxygen type amorphous material, a desirable substance is selected from those for formation of the barrier layer as mentioned above and a starting material which can be a starting gas for supplying oxygen atom may be used in combination. As such starting materials for introduction of oxygen atom, there may be employed most of gaseous substances or gasified gasifiable substances containing oxygen atom as constituent atom.

For example, when a starting gas having silicon atom (Si) as constituent atom is to be used, it is possible to use a mixture of a starting gas having silicon atom(Si) as constituent atom, a starting gas having oxygen atom(O) as constituent atom and, if necessary, a gas gaving hydrogen atom(H) and/or halogen atom(X) as constituent atom at a desired mixing ratio. Alternatively, a mixture of a starting gas having silicon atom(Si) as constituent atom and a starting gas having oxygen atom(O) and hydrogen atom(H) as constituent atom at a desired mixing ratio can also be used. Further it is also possible to use a mixture of a starting gas having silicon atom(Si) as constituent atom and a starting gas having the three kind of atoms of silicon atom (Si), oxygen atom(O) and hydrogen atom(H) as constituent atoms.

As another method, it is also possible to use a mixture of a starting gas having silicon atom(Si) and hydrogen atom(H) as constituent atoms and a starting gas having oxygen atom(O) as constituent atom.

More specifically, there may be mentioned oxygen($O_2$), ozone($O_3$), carbon monoxide(CO), carbon dioxide($CO_2$), nitrogen monoxide(NO), nitrogen dioxide($NO_2$), dinitrogen oxide($N_2O$), dinitrogen trioxide($N_2O_3$), dinitrogen tetraoxide ($N_2O_4$), dinitrogen pentoxide($N_2O_5$), nitrogen trioxide($NO_3$), lower siloxanes containing Si, O and H as constituent atoms such as disiloxane($H_3SiOSiH_3$), trisiloxane($H_3SiOSiH_2OSiH_3$), and so on.

As described above, when forming a barrier layer 102 according to the glow discharge method, the starting materials for formation of the barrier layer are suitably selected from the above-mentioned materials so as to form the barrier layer 102 having the desired characteristics and being constituted of the desired constituent atoms. For example, when using the glow discharge method, there may be employed a single gas such as $Si(CH_3)_4$ or $SiCl_2(CH_3)_2$, or a gas mixture such as $SiH_4$-$N_2O$ system, $SiH_4$-$O_2$(-Ar) system, $SiH_4$-$NO_2$ system, $SiH_4$-$O_2$-$N_2$ system, $SiCl_4$-$CO_2$-$H_2$ system, $SiCl_4$-$NO$-$H_2$ system, $SiH_4$-$NH_3$ system, $SiCl_4$-$NH_4$ system, $SiH_4$-$N_2$ system, $SiH_4$-$NH_3$-$NO$ system, $Si(CH_3)_4$-$SiH_4$ system, $SiCl_2(CH_3)_2$-$SiH$ system, etc. as the starting material for formation of the barrier layer 102.

For formation of the barrier layer 102 constituted of a carbon type amorphous material by the sputtering method, a single crystalline or polycrystalline Si wafer or C wafer or a wafer containing Si and C mixed therein is used as target and subjected to sputtering in an atmosphere of various gases.

For example, when Si wafer is used as target, a starting gas for introduction of carbon atom and hydrogen atom(H) or halogen atom(X), which may be diluted with a diluting gas, if desired, is introduced into a deposition chamber for sputtering to form a gas plasma therein and effect sputtering of said Si wafer.

Alternatively, Si and C as separate targets or one sheet target of a mixture of Si and C can be used and sputtering is effected in a gas atmosphere containing at least hydrogen atom(H) or halogen atom(X).

As the starting gas for incorporation of carbon atom, or hydrogen atom or halogen atom, there may be employed those as mentioned in the glow discharge as described above as effective gases also in case of sputtering.

For formation of the barrier layer 102 constituted of a nitrogen type amorphous material by the sputtering method, a single crystalline or polycrystalline Si wafer or $Si_3N_4$ wafer or a wafer containing Si and $Si_3N_4$ mixed therein is used as target and subjected to sputtering in an atmosphere of various gases.

For example, when Si wafer is used as target, a starting gas for incorporation of nitrogen atom and, if necessary, hydrogen atom and/or halogen atom, such as $H_2$ and $N_2$ or $NH_3$, which may be diluted with a diluting gas, if desired, is introduced into a deposition chamber for sputtering to form a gas plasma therein and effect sputtering of said Si wafer.

Alternatively Si and $Si_3N_4$ as separate targets or one sheet target of a mixture of Si and $Si_3N_4$ can be used and sputtering is effected in a diluted gas atmosphere as a gas for sputtering or a gas atmosphere containing at least hydrogen atom(H) and/or halogen atom(X).

As the starting gas for introduction of nitrogen atoms, there may be employed those for formation of the barrier layer as mentioned in the glow discharge as described above as effective gases also in case of sputtering.

For formation of the barrier layer 102 constituted of an oxygen type amorphous material by the sputtering method, a single crystalline or polycrystalline Si wafer or $SiO_2$ wafer, or a wafer containing Si and $SiO_2$ mixed therein is used as target and subjected to sputtering in an atmosphere of various gases.

For example, when Si wafer is used as target, a starting gas for incorporation of oxygen atom and, if necessary hydrogen atom or/and halogen atom, which may be diluted with a diluting gas, if desired, is introduced into a deposition chamber for sputtering to form a gas plasma therein and effect sputtering of said Si wafer.

Alternatively, Si and $SiO_2$ as separate targets or one sheet target of a mixture of Si and $SiO_2$ can be used and sputtering is effected in a gas atmosphere containing at least hydrogen atom(H) and/or halogen atom(X) as constituent elements. As the starting gas for introduction of oxygen atom, there may be employed those as mentioned in the glow discharge as described above as effective gases also in case of sputtering.

In the present invention, as the diluting gas to be employed in forming the barrier layer 102 according to the glow discharge method or the sputtering method, there may included so-called rare gases such as He, Ne or Ar as suitable ones.

When a barrier layer 102 according to the present invention is constituted of the amorphous material as described above, it is formed carefully so that the characteristics required may be given exactly as desired.

In other words, a substance constituted of silicon atom(Si) and at least one of carbon atom(C), nitrogen atom(N) and oxygen atom(O), and optionally hydrogen atoms(H) or/and halogen atoms(X) can take various forms from crystalline to amorphous electrical properties from conductive through semiconductive to insulating, and properties from photoconductive to non-photoconductive depending on the preparation conditions. In the present invention, the preparation conditions are severely selected so that there may be formed non-photoconductive amorphous materials at least with respect to the light in so-called visible region.

Since the function of the amorphous barrier layer 102 is to bar injection of free carriers from the side of the support 101 into the charge generation layer 104, or from the side of the charge generation layer 104 to the side of the support 101, while permitting easily the photocarriers generated in the charge generation layer 104 to be migrated and passed therethrough to the side of the support 101, it is desirably formed so as to exhibit electrically insulating behaviours.

The barrier layer 102 is formed also to have a mobility value with respect to passing carriers to the extent that passing of photocarriers generated in the charge generation layer 104 may be passed through the barrier layer 102.

As an important factor in the conditions for preparation of the barrier layer 102 of the aforesaid amorphous material having the characteristics as described above, there may be mentioned the support temperature during preparation of the layer.

In other words, in forming the barrier layer 102 constituted of the aforesaid amorphous material on the surface of the support 101, the support temperature during the layer formation is an important factor affecting the structure and characteristics of the layer formed. In the present invention, the support temperature during the layer formation is severely controlled so that the aforesaid amorphous material having the intended characteristics may be prepared exactly as desired.

In order that the objects of the present invention may be achieved effectively, the support temperature during formation of the barrier layer 102, which is selected conveniently within an optimum range depending on the method employed for formation of the barrier layer 102, is generally 100° to 300° C., preferably 150° to 250° C. For formation of the barrier layer 102, it is advantageous to adopt the glow discharge method or the sputtering method, since with these methods control of the atomic ratios constituting each layer or layer thicknesses is relatively compared to with other methods, during the continuous formation of the photoconductive layer 103 on the barrier layer 102 in the same system, and further a third layer may be formed on the photoconductive layer 103, if desired. In case of forming the barrier layer 102 according to these layer forming methods, the discharging power and gas pressure during layer formation may also be mentioned, similarly as the support temperature as described above, as important factors influencing the characteristics of the barrier layer 102 to be prepared.

The discharging power condition for preparing effectively with good productivity the barrier layer 102 having the characteristics to achieve the objects of the present invention is generally 1 to 300 W, preferably 2 to 150 W. The gas pressure in the deposition chamber is generally $3 \times 10^{-3}$ to 5 Torr, preferably about $8 \times 10^{-3}$ to 0.5 Torr.

The contents of carbon atom, nitrogen atom, oxygen atom, hydrogen atom and halogen atom in the barrier layer 102 of the photoconductive member according to the present invention are also important factors, similarly as the conditions for preparation of the barrier layer 102, in order to form the barrier layer having the desired characteristics to achieve the objects of the present invention.

When the barrier layer 102 is constituted of a-$Si_aC_{1-a}$, the content of carbon atom is generally 60 to 90 atomic % based on silicon atom, preferably 65 to 80 atomic %, most preferably 70 to 75 atomic %, namely in terms of representation by a, being 0.1 to 0.4, preferably 0.2 to 0.35, most preferably, 0.25 to 0.3. In case of a-$(Si_bC_{1-b})_cH_{1-c}$, the content of carbon atom is generally 30 to 90 atomic %, preferably 40 to 90 atomic %, most preferably 50 to 80 atomic %, the content of hydrogen atom is generally 1 to 40 atomic %, preferably 2 to 35 atomic %, most preferably 5 to 30 atomic %, namely in terms of representation by b and c, b being generally 0.1 to 0.5, preferably 0.1 to 0.35, most preferably 0.15 to 0.3 and c being 0.60 to 0.99, preferably 0.65 to 0.98, most preferably 0.7 to 0.95. In case of a-$(Si_dC_{1-d})_eX_{1-e}$ or a-$(Si_fC_{1-f})(H+X)_{1-g}$, the content of carbon atom is generally 40 to 90 atomic %, preferably 50 to 90 atomic %, most preferably 60 to 80 atomic %, the content of halogen atom or the total content of halogen atom and hydrogen atom is generally 1 to 20 atomic %, preferably 1 to 18 atomic %, most preferably 2 to 15 atomic %, and the hydrogen atom content, when both halogen atom and hydrogen atom are contained, is generally 19 atomic % or less, preferably 13 atomic % or less, namely in terms of representation by d, e, f and g, d or f being generally 0.1 to 0.47, preferably 0.1 to 0.35, most preferably 0.15 to 0.3 and e or g being generally 0.8 to 0.99, preferably 0.85 to 0.99, most preferably 0.85 to 0.98.

When the barrier layer 102 is constituted of a nitrogen type amorphous material, first in case of a-$Si_hN_{1-h}$, the content of nitrogen atom is generally 43 to 60 atomic % based on silicon atom, preferably 43 to 50 atomic %, namely in terms of h, generally 0.43 to 0.60, preferably 0.43 to 0.50.

In case of a-$(Si_iN_{1-i})_jH_{1-j}$, the content of nitrogen atom is generally 25 to 55 atomic %, preferably 35 to 55 atomic %, the content of hydrogen atom is generally 2 to 35 atomic %, preferably 5 to 30 atomic %, namely in terms of representation by i and j, i being generally 0.43 to 0.6, preferably 0.43 to 0.5, and j being 0.65 to 0.98, preferably 0.7 to 0.95. In case of a-$(Si_kC_{1-k})_lX_{1-l}$ or a-$(Si_mC_{1-m})_nX_{1-n}$, the content of nitrogen atom is generally 30 to 60 atomic %, preferably 40 to 60 atomic %, the content of halogen atom or the total content of halogen atom and hydrogen atom is generally 1 to 20 atomic %, preferably 2 to 15 atomic %, and the hydrogen atom content when both halogen atom and hydrogen atom are contained is generally 19 atomic % or less, preferably 13 atomic % or less, namely in terms of representation by k, l, m and n, k or l being generally 0.43 to 0.60, preferably 0.43 to 0.49 and m or n being generally 0.8 to 0.99, preferably 0.85 to 0.98.

When the barrier layer 102 is constituted of an oxygen type amorphous material, first in case of a-$Si_oN_{1-o}$, the content of oxygen atom is generally 60 to 67 atomic % based on silicon atom, preferably 63 to 67 atomic %, namely in terms of o, generally 0.33 to 0.40, preferably 0.33 to 0.37.

In case of $(Si_pO_{1-p})_qH_{1-q}$, the content of oxygen atom, is generally 39 to 66 atomic %, preferably 42 to 64 atomic %, and the content of hydrogen atom generally 2 to 35 atomic %, preferably 5 to 30 atomic %, namely in terms of representation by p and q, p being generally 0.33 to 0.40, preferably 0.33 to 0.37 and q generally 0.65 to 0.98, preferably 0.70 to 0.95.

When the barrier layer 102 is constituted of a-$(Si_rO_{1-r})_sX_{1-s}$ or a-$(Si_rO_{1-t})_u(H+X)_{1-u}$, the content of oxygen atom in the barrier layer 102 is generally 48 to 66 atomic %, preferably 51 to 66 atomic %, the content of halogen atom or the total content of halogen atom and hydrogen atom generally 1 to 20 atomic %, preferably 2 to 15 atomic %, and the content of hydrogen atom when both halogen atom and hydrogen atom are contained is 19 atomic % or less, preferably 13 atomic % or less. As represented in terms of r, s, t and u, r or s is generally 0.33 to 0.40, preferably 0.33 to 0.37, and t or u generally 0.80 to 0.99, preferably 0.85 to 0.98.

As the electrically insulating metal oxides for constituting the barrier layer 102 in the present invention, there may preferably mentioned $TiO_2$, $Ce_2O_3$, $ZrO_2$, $HfO_2$, $GeO_2$, CaO, BeO, $P_2O_5$, $Y_2O_3$, $Cr_2O_3$, $Al_2O_3$, MgO, $MgO.Al_2O_3$, $SiO_2.MgO$, etc. A mixture of two or more kinds of these compounds may also be used to form the barrier layer 102.

The barrier layer 102 constituted of electrically insulating metal oxides may be formed by the vacuum deposition method, the CVD (chemical vapor deposition) method, the glow discharge decomposition method, the sputtering method, the ion implantation method, the ion plating method, the electron-beam method or the like.

These preparation methods may be suitably selected depending on the preparation conditions, the degree of loading of capital investment, production scale, the desired characteristics of the photoconductive member to be prepared.

For formation of the barrier layer 102 by the sputtering method, for example, a wafer for formation of a barrier layer may be used as target and subjected to sputtering in an atmosphere of various gases such as He, Ne or Ar.

When the electron-beam method is used, there is placed a starting material for formation of the barrier layer in a boat for deposition, which may in turn be irradiated by an electron beam to effect vapor deposition of said material. Since the function of the barrier layer 102 of this invention is to bar penetration of carriers from the side of the support 101 into the photoconductive layer 103, while permitting easily the photocarriers generated in the photoconductive layer 103 to be migrated and passed therethrough to the side of the support 101, the metal oxide which is one of the materials constituting the barrier layer 102 is selected and used so as to exhibit electrically insulating behaviors.

The numerical range of the layer thickness of the barrier layer 102 according to the present invention is also another important factor to achieve effectively the object of this invention.

In other words, if the layer thickness of the barrier layer 102 is too thin, the function of barring penetration of free carriers from the side of the support 101 to the side of the charge generation layer 104 or from the side of the charge generation layer 104 to the side of the support 101 cannot sufficiently be fulfilled. On the contrary, if the thickness is too thick, the probability of the photocarriers generated in the charge generation layer 104 to be passed to the side of the support 101 is very small. Thus, in neither case can, the objects of this invention be effectively achieved.

In view of the above points, the layer thickness of the barrier layer 102 to achieve effectively the objects of this invention is generally in the range of from 30 to 1000 Å, preferably from 50 to 600 Å.

In the present invention, in order to achieve its objects effectively, the charge generation layer 104 laminated on the barrier layer 102 generates photocarriers when irradiated by electromagnetic waves, especially efficiently by absorption of electromagnetic waves in the long wavelength region. Such charge generation layer 104 is constituted of a-Si(H, X) having the semiconductor characteristics as shown below, to which an impurity which controls the so-called conduction type is heavily added.

① $p^+$-type a-Si (H, X) ... containing only acceptor, namely, $1 \times 10^{-1}$ to 10 atomic % of a p-type impurity or containing both donor and acceptor with relatively higher concentration of acceptor(Na), containing as a relative value $1 \times 10^{-1}$ to 10 atomic % of a p-type impurity;

② $n^+$-type a-Si (H, X) ... containing only donor, namely, $1 \times 10^{-1}$ to 10 atomic % of a n-type impurity; or containing both donor and acceptor with relatively higher concentration of donor(Nd), containing as a relative value $1 \times 10^{-1}$ to 10 atomic % of n-type impurity.

The charge generation layer 104 in the photoconductive member 100 of the present invention has the function to generate photocarriers by absorbing primarily electromagnetic waves projected upon forming electrostatic images. By incorporation of $1 \times 10^{-1}$ to 10 atomic % of an impurity which controls the conduction type as described above, it can be improved to a great extent in photosensitivity in the longer wavelength region as compared with the photoconductive member or prior art, while satisfying also the characteristics of a charge generation layer in a photoconductive member.

Accordingly, it is possible to use a laser oscillating a light in the longer wavelength hand such as AlGaAs semiconductor laser (oscillated light: 0.8 μm band, 0.7 μm band) as light source. Of course, the charge generation layer 104 can generate sufficient amount of photocarriers by a light with shorter wavelengths than in these wavelength regions, and hence a light source emitting a light in such a short wavelength region may also be available.

The charge transport layer 105 as described hereinafter is constituted of a-Si(H, X) having ordinary spectral photosensitive characteristics. Therefore, when a light source emitting a light in ordinary visible light region (e.g. halogen lamp, tungsten lamp, fluorescent tube) is used, generation of photocarriers will occur in said layer 105, because the light emitted from such a light source is absorbed primarily by the said charge transport layer 105. Thus, even in this case, the photoconductive member of this invention can be satisfactorily utilized.

In summary, the photoconductive member of the present invention can exhibit sufficient photosensitivity and rapid response to light over a wide range of wavelengths of light, including ordinary visible light region to the longer wavelength band of visible light region and even a light with wavelengths in further longer wavelength region, and therefore various light sources with various wavelength regions can be employed.

The quantity of the impurity contained in the charge generation layer 104 is generally in the numerical range as specified above, but more preferably in the range of from $5 \times 10^{-1}$ to 10 atomic % to give further improved effects. The layer thickness of the charge generation layer 104 is desired to be set as thin as possible within the range capable of absorbing sufficiently the electromagnetic waves projected, and generally 0.3 to 5μ, preferably 0.5 to 2μ.

In the image forming member for electrophotography as shown in FIG. 1, in order to achieve effectively the objects of the present invention, the charge transport layer 105 laminated on the charge generation layer 104 has the function to transport effectively the charges generated in the charge generation layer 104 and at the same time the function to generate photocarriers by absorption of a light in the visible light region. Such charge transport layer 105 is constituted of a-Si(H, X) having the semiconductor characteristics as shown below.

① p-type a-Si (H, X) . . . containing only acceptor; or containing both donor and acceptor with relatively higher concentration of acceptpr;

② p⁻-type a-Si (H,X) . . . in the type of ①, in which acceptor that concentration(Na) is low or relatively lower;

③ n-type a-Si (H, X) . . . containing only donor; or containing both donor and acceptor with relatively higher concentration of donor;

④ n⁻-type a-Si (H, X) . . . in the type ③, in which donor concentration(Nd) is low or relatively lower;

⑤ i-type a-Si (H, X) . . . Na≈Nd≈O or Na≈Nd.

In the present invention, typical examples of halogen atom(X) to be incorporated in the charge transport layer 105 are fluorine, chlorine, bromine and iodine, especially preferably fluorine and chlorine.

In the present invention, formation of a charge generation layer 104 or a charge transport layer 105 constituted of a-Si(H, X) may be conducted according to the vacuum deposition method utilizing discharging phenomenon, such as the glow discharge method, the sputtering method or the ion-plating method. For example, for formation of a charge transport layer constituted of a-Si(H, X) according to the glow discharge method, a starting gas for introduction of hydrogen atom or/and halogen atom is introduced together with a starting gas for supplying silicon atoms(Si) into the deposition chamber which can be internally brought to reduced pressure, wherein glow discharge is generated thereby to form a layer of a-Si(H, X) on the surface of a support placed at a predetermined position in the chamber. When it is to be formed according to the sputtering method, a starting gas for introduction of hydrogen atom or/and halogen atom may be introduced into the chamber for sputtering, when effecting sputtering upon the target formed of silicon(Si) in an atmosphere of an inert gas such as Ar, He or a gas mixture based on these gases.

The starting gas for supplying Si to be used in the present invention may include gaseous or gasifiable silicon hydrides(silanes) such as $SiH_4$, $Si_2H_6$, $Si_3H_8$, $Si_4H_{10}$ and others as effective materials. In particular, $SiH_4$ and $Si_2H_6$ are preferred with respect to easy handling during layer formation and efficiency for supplying Si.

As the effective starting gas for incorporation of halogen atom to be used in the present invention, there may be mentioned a number of halogen compounds such as halogen gases, halides, interhalogen compounds and halogen substituted silane derivatives which are gaseous or gasifiable.

Alternatively, it is also effective in the present invention to use a gaseous or gasifiable silicon compound containing halogen atom which is constituted of both silicon atom and halogen atom.

Typical examples of halogen compounds preferably used in the present invention may include halogen gases such as of fluorine, chlorine, bromine or iodine and interhalogen compounds such as BrF, ClF, $ClF_3$, $BrF_5$, $BrF_3$, $IF_7$, $IF_5$, ICl, IBr, etc.

As the silicon compound containing halogen atom, halogen substituted silane derivatives such as $SiF_4$, $Si_2F_6$, $SiCl_4$, $SiBr_4$, or the like are preferred.

When the specific photoconductive member of this invention is formed according to the glow discharge method by the use of such a silicon compound containing halogen atom, it is possible to form a charge generation layer 104 or a charge transport layer 105 constituted of a-Si:X on a given support without using silane gas as the starting gas capable of supplying Si.

In forming the charge generation layer 104 or charge transport layer 105 containing halogen atom according to the glow discharge method, the basic procedure comprises feeding a starting gas for supplying Si, namely, a gas of silicon halide and a gas such as Ar, $H_2$, He, etc. at a predetermined ratio in a suitable flow amount into the deposition chamber for formation of the charge generation layer or the charge transport layer, followed by excitation of glow discharge to form a plasma atmosphere of these gases, thereby forming the charge generation layer 104 on the barrier layer 102 previously formed on a support or the charge transport layer 105 on the charge generation layer 104. It is also possible to form a layer by mixing a gas of a silicon compound containing hydrogen atom at a suitable ratio with these gases in order to incorporate hydrogen atom therein.

Each of the gases for introduction of respective atoms may be either a single species or a mixture of plural species at a predetermined ratio. For formation of a charge generation layer or charge transport layer of a-Si(H, X) by the reaction sputtering method or the ion-plating method, for example, a target of Si is used and sputtering is effected thereon in a suitable gas plasma atmosphere in case of the sputtering method. Alternatively, in case of the ion-plating method, a polycrystalline or single crystalline silicon is placed as vaporization source in a vapor deposition boat, and the silicon vaporization source is vaporized by heating by the resistance heating method or the electron beam method(EB method) thereby to pass vaporized flying substances through a suitable gas plasma atmosphere.

During this procedure, in either the sputtering method or the ion-plating method, for incorporation of halogen atom into the layer formed, a gas of a halogen compound as mentioned above or a silicon compound containing halogen as mentioned above may be introduced into the deposition chamber to form a plasma atmosphere of said gas therein.

When hydrogen atom is introduced, a starting gas for incorporation of hydrogen atom such as $H_2$ and a gas such as silanes as mentioned above may be introduced into the deposition chamber for sputtering, followed by formation of a plasma atmosphere of said gases.

In the present invention, as the starting gas for introduction of halogen atom, the halogen compounds or silicon compounds containing halogens as mentioned above can effectively be used. In addition, it is also possible to use a gaseous or gasifiable halide containing hydrogen atom as one of the constituents such as hydrogen halide, including HF, HCl, HBr, HI and the like or halogen-substituted hydrogenated silicon, including $SiH_2F_2$, $SiH_2Cl_2$, $SiHCl_3$, $SiH_2Br_2$, $SiHBr_3$ and the like as an effective starting material for formation of a charge generation layer and a charge transport layer.

These halides containing hydrogen atom, which can introduce hydrogen atom very effective for controlling electrical or optical characteristics into the layer during formation of the charge generation layer or charge transport layer simultaneously with introduction of halogen atom, can preferably be used as the starting material for introduction of halogen.

For incorporation of hydrogen atom structurally into the charge generation layer or charge transport layer $H_2$ or a gas of hydrogenated silicon, including $SiH_4$, $Si_2H_6$, $Si_3H_8$, $Si_4H_{10}$ and so on may be permitted to be co-present with a silicon compound for formation of a-Si in a deposition chamber, wherein discharging is excited.

For example, in case of the reaction sputtering method, a Si target is used and a gas for incorporation of halogen atoms and $H_2$ gas are introduced together with, if necessary, an inert gas such as He, Ar, etc. into a deposition chamber, wherein a plasma atmosphere is formed to effect sputtering of said Si target, thereby forming a charge transport layer of a-Si(H, X) on the charge generation layer 104 having the desired characteristics.

Further, there may also be introduced a gas such as of $B_2H_6$, $PH_3$, $PF_3$ or others in order to effect also addition of impurities.

The amount of hydrogen atom(H) or halogen atom(X) incorporated in the charge generation layer or charge transport layer in the present invention, or total amount of both of these atoms, may be generally 1 to 40 atomic %, preferably 5 to 30 atomic %.

For controlling the amounts of hydrogen atom(H) or/and halogen atom(X) incorporated in these layers, the deposition support temperature or/and the amounts of the starting materials for incorporation of hydrogen atom(H) or halogen atom(X) to be introduced into the deposition device system, the discharging power, and the like may be controlled.

In order to make the charge transport layer n-type, p-type or i-type, or to make the charge generation layer $n^+$-type or $p^+$-type, n-type impurity, p-type impurity or both impurities can be added into the layer in a controlled amount during formation of the layer by the glow discharge method or the reaction sputtering method.

As the impurity to be added into the charge generation layer and the charge transport layer to make it p-type, there may be mentioned preferably an element in the Group III A of the periodic table, for example, B, Al, Ga, In, Tl, etc.

On the other hand, as n-type impurities there may preferably be used an element in the Group VA of the periodic table, such as N, P, As, Sb, Bi, etc.

The impurities as described above are contained in the layer in an amount on the order of ppm, and therefore it is not necessary to pay such a great attention to the pollution caused thereby as in case of the principal ingredients constituting the charge transport layer, but it is also preferable to use a substance which is as less pollutive as possible. From such a standpoint, also in view of the electrical and optical characteristics of the layer formed, a material such as B, Ga, P and Sb is most preferred. In addition, for example, it is also possible to control the layer to n-type by interstitial addition of Li or others through thermal diffusion or implantation.

The amount of the impurity to be added into the charge transport layer, which is determined suitably depending on the electrical and optical characteristics desired, but in the range of an impurity in the Group III A of the periodic table, generally from non-dope up to $5 \times 10^{-3}$ atomic ratio to make the layer $n^-$-type, i-type or $p^-$-type, and in the range of an impurity in the Group III A from $5 \times 10^{-3}$ to $1 \times 10^{-2}$ atomic % to make the layer p-type. In order to make the layer n-type, an impurity in the Group V A of the periodic table, in an amount of $5 \times 10^{-3}$ atomic % or less is desirably added.

The layer thickness of the charge transport layer may be determined suitably as desired so that the photocarriers generated in the charge generation layer may be effectively injected and the injected photocarriers may be transported efficiently in a certain direction, but is generally in the range from 3 to 100μ preferably from 5 to 50μ.

In the present invention, since there is provided the barrier layer 102, even one having relatively lower electric resistance can be used for the charge transport layer 105. But, for obtaining better results, the dark resistance of the charge transport layer 105 formed may preferably be $5 \times 10^9$ Ω cm or more, most preferably $10^{10}$ Ω cm or more.

In particular, the numerical condition for the dark resistance values is an important factor when using the prepared photoconductive member as an image-forming member for electrophotography, as a high sensitive reading device or an image pickup device to be used under low illuminance regions, or as a photoelectric convertor.

The layer thickness of the photoconductives layer 103 in the photoconductive member according to the present invention may suitably be determined as desired in conformity with the purpose of application such as reading device, image pickup device or image-forming member for electrophotography.

In the present invention, the layer thickness of the photoconductive layer 103 is determined suitably in relation to the thickness of the barrier layer 102 so that both the function of the photoconductive layer 103 and the function of the barrier layer 102 may effectively be exhibited respectively to achieve effectively the objects of the present invention. Usually, the layer thickness of the photoconductive layer may preferably be some hundred to some thousand times as thick as that of the barrier layer 102.

FIG. 2 shows a schematic sectional view for illustration of the constitution of another embodiment of the photoconductive member of this invention. The photoconductive member 200 as shown in FIG. 2 has the same layer structure as the photoconductive member 100 as shown in FIG. 1, except that there is provided a second barrier layer 206 between the charge generation layer 204 and the charge transport layer 205, and each of the first barrier layer 202, the charge generation layer 204 and the charge transport layer 205 is the same with respect to the material constituting the layer, the layer thickness and characteristics as each corresponding layer shown in FIG. 1.

The function of the second barrier layer 206 is to bar injection of free carriers in the charge generation layer from the side of the charge generation layer 204 to the side of the charge transport layer 205 or to bar injection of free carriers in the charge transport layer 205 from the side of the charge transport layer 205 to the side of the charge generation layer 204, and also to easily permit passage of the photocarriers to be migrated toward the side of the charge transport layer 205 among the photocarriers generated in the charge generation layer 204 to the side of the charge transport layer 205, thereby efficiently injecting the photocarriers into the charge transport layer 205.

The second barrier layer 206 may be formed using the same material and in the same manner as in preparation of the first barrier layer 202, and its layer thickness is made approximately the same as that of the first barrier layer 202. The thickness of the second barrier layer 205, however, is desired to be sufficiently thin, so far as it is endowed with the characteristics to fulfill its function. More specifically, the layer thickness of the second barrier layer 206 is generally 10 to 1000 Å, preferably 20 to 500 Å.

FIG. 3 shows a schematic sectional view for illustration of the third embodiment of the photoconductive member of this invention. The photoconductive member 300 as shown in FIG. 3 is the same with respect to the layer structure and the function of each layer as the photoconductive member 100 as shown in FIG. 1, except that a surface barrier layer 306 is provided on the upper surface of the charge transport layer 305 in the same layer structure as in the photoconductive member 100 as shown in FIG. 1.

The surface barrier layer 306 is loaded with the function to bar injection of the surface charges into the charge transport layer 305, when charging treatment is applied on its surface.

The surface barrier layer 306 may be constituted of a material chosen as desired from the materials as mentioned above for constitution of the first barrier layer 302.

Choice of the material constituting the surface barrier layer 306 and determination of its layer thickness should be done carefully, when the photoconductive member 300 is used in a manner to receive irradiation of an electromagnetic wave, to which the photoconductive layer 303 is sensitive, from the side of the surface barrier layer 306, so that the electromagnetic wave irradiated may reach the photoconductive layer 303 in a sufficient quantity to excite generation of photocarriers with good efficiency.

The surface barrier layer 306 may be formed in the same manner as in formation of the first barrier layer 302, for example, by the glow discharge method or the reaction sputtering method.

The layer thickness of the surface barrier layer 306 may suitably be determined depending on the material constituting the layer and the conditions for formation of the layer so as to have the function as mentioned above exhibited sufficiently.

The layer thickness of the surface barrier layer 306 in the present invention is desired to be generally 30 Å to 5μ, preferably 50 Å to 2μ.

In FIG. 4, there is shown a schematic sectional view for illustration of the constitution of the fourth embodiment of the photoconductive member of this invention.

The photoconductive member 400 as shown in FIG. 4 has a layer structure, having the first barrier layer 402 on the support 401, the photoconductive layer 403 on said barrier layer 402, and the surface barrier layer 407 on said photoconductive layer 403, said photoconductive layer 403 having the second barrier layer 406 interposed between the charge generation layer 404 and the charge transport layer 405, said charge generation layer 404 being provided on the lower side and said charge transport layer 405 on the upper side of said second barrier layer 406.

The function of each layer constituting the photoconductive member 400 is the same as each corresponding layer in the photoconductive members as described in FIG. 1 to FIG. 3, and its constituting material and layer thickness are also the same.

The photoconductive members in the embodiments as shown in FIG. 5 and FIG. 6 have photoconductive layers 502 and 603, respectively with a layer structure, in which a charge transport layer is provided on the side nearer to the support and a charge generation layer on the side farther from the support, as contrasted to the layer structure in the embodiments as shown in FIG. 1 to FIG. 4, in which a charge generation layer is provided on the side nearer to the support and a charge transport layer on the side farther from the support.

The photoconductive member 500 according to the embodiment as shown in FIG. 5 has a layer structure, having the charge transport layer 503 and the charge generation layer 504 on the support 501 with the intermediary barrier layer 505 disposed between these layers and also the surface barrier layer 506 provided on the surface of said charge generation layer 504. The barrier layer 505 has the function to bar injection of free carriers in the charge generation layer 504 toward the side of the charge transport layer 503 and to easily permit passage of the photocarriers to be migrated toward the side of the charge transport layer 503 among the photocarriers generated in the charge generation layer 504 to the side of the charge transport layer 503. The barrier layer 505 may be formed in the same manner as the formation of the barrier layer 206 as shown in FIG. 2, and its layer thickness is also the same as that of the barrier layer 206.

The photoconductive member 600 of the sixth embodiment as shown in FIG. 6 has a layer structure, having the first barrier layer 602 on the lower side of the photoconductive layer 603, i.e. on the support 601 and the surface barrier layer 607 on the upper side thereof, said photoconductive layer 603 having the charge transport layer 604 provided on the side of the support 601, the charge generation layer 605 provided on the side of the surface barrier layer 607 and the barrier layer 606 provided between the charge transport layer 604 and the charge generation layer 605. The layer thickness of the barrier layer 606 is the same as that of the barrier layer 206 as shown in FIG. 2.

The photoconductive member 700 of the seventh embodiment as shown in FIG. 7 has a layer structure, having the photoconductive layer 702 provided on the support 701, said photoconductive layer 702 having in its internal region the charge generation layer 705 interposed between the barrier layer 706 and the barrier layer 707, and having the first charge transport layer 703 on the outside of the barrier layer 706 and the second transport layer 704 on the outside of the barrier layer 707. The barrier layers 706 and 707 each function to bar injection of free carriers in the charge generation layer 705 to the side of each charge transport layer and to easily permit passage of the photocarriers generated in the charge generation layer 705 to the side of each charge transport layer.

The thickness of the barrier layer 706 and 707 may be the same as that of the barrier layer 206 as shown in FIG. 2 and constituted of the same material as that of the barrier layer 206.

FIG. 8 shows a schematic sectional view for illustration of the constitution of the eighth embodiment of the photoconductive member of this invention.

The photoconductive member 800 as shown in FIG. 8 is constituted of the photoconductive layer 802 on the support 801 and the surface barrier layer 803 provided in direct contact with said photoconductive layer 802, said photoconductive layer 802 having a layer structure differentiated in functions, i.e. consisting of the charge transport layer 804 and the charge generation layer 805.

The surface barrier layer 803 constituting the photoconductive member 800 as shown in FIG. 8 has the same characteristics as those of the surface barrier layer 306 as shown in FIG. 3, and may be formed using the same material as that for constituting the surface barrier layer 306 according to the same preparation conditions and procedures. The charge transport layer 804 and the charge generation layer 805 have also the same characteristics as those of the charge transport layer 105 and the charge generation layer 104 as shown in FIG. 1, respectively, and they can be formed in the same manner as formation of the charge transport layer 105 and the charge generation layer 104, respectively.

FIG. 9 shows a schematic sectional view for illustration of the constitution of the ninth embodiment of the photoconductive member of this invention. The photoconductive member 900 as shown in FIG. 9 has the same layer structure as the photoconductive member as shown in FIG. 8, except that the lower barrier layer 906 is provided between the support 901 and the charge transport layer 904.

The lower barrier layer 906 has the function to bar injection of free carriers from the side of the support 901 to the side of the charge transport layer 904 and also the function to easily permit passage of the photocarriers to be migrated to the side of the support 901 among the photocarriers generated in the charge generation layer 905 by irradiation of an electromagnetic wave through the lower barrier layer 906. The material constituting the lower barrier layer may be chosen as desired from those to be used for constitution of the barrier layer 102 as shown in FIG. 1 and it can also be formed in the same manner as in formation of the barrier layer 102.

EXAMPLE 1

Using a device as shown in FIG. 10 placed in a clean room which had been completely shielded, a photoconductive member having the layer structure as shown in FIG. 1 was prepared according to the following procedures.

A substrate of molybdenum 1002 of 10 cm square having a thickness of 0.5 mm, whose surface had been cleaned, was fixed firmly on a supporting member 1003 disposed at a predetermined position in a deposition chamber 1001. The targets 1005, 1006 consisted of a high purity polycrystalline silicon (99.999%) provided on a high purity graphite (99.999%). The substrate 1002 was heated by a heater 1004 within the supporting member 1003 with a precision of ±0.5° C. The temperature was measured directly at the backside of the substrate by an alumel-chromel thermocouple. Then, after confirming that all the valves in the system were closed, the main valve 1031 was opened fully to evacuate once to about $5 \times 10^{-7}$ Torr (during this operation all the valves in the system were closed). Subsequently, the auxiliary valve 1029, and then the outflow valves 1024, 1025, 1026, 1027, 1028 were opened to remove sufficiently the gases in the flowmeters 1037, 1038, 1039, 1040 and 1041. Then, the outflow valves 1024, 1025, 1026, 1027, 1028, and the auxiliary valve 1029 were closed. The heater 1004 was then turned on to set the substrate temperature at 200° C. The valve 1018 of the bomb 1013 containing Ar gas (purity: 99.999%) were opened until the reading on the outlet pressure gage 1036 was adjusted to 1 kg/cm², and then the inflow valve 1023 was opened, followed by gradual opening of the outflow valve 1028 to permit Ar gas to flow into the deposition chamber 1001. The outflow valve 1028 was gradually opened until the indication on the Pirani gage 1042 became $5 \times 10^{-4}$ Torr. After the flow amount was stabilized under this state, the main valve 1031 was gradually closed to narrow the opening until the pressure in the chamber became $1 \times 10^{-2}$ Torr. After confirming that the flowmeter 1041 was stabilized, with the shutter 1008 being opened, and then the high frequency power source 1043 was turned on to input an alternate power of 13.56 MHz, 100 W between the targets 1005, 1006 and the supporting member 1003. A layer was formed while taking matching so as to continue stable discharging under these conditions. After discharging was continued under these conditions for one minute, a first blocking layer with a thickness of 100 Å was formed. Then, the high frequency power source 1043 was turned off for intermission of discharging. Subsequently, the outflow valves 1028 was closed and the main valve 1031 fully opened to discharge the gas in the deposition chamber 1001 until it was evacuated to $5 \times 10^{-7}$ Torr. Then, the input voltage at the heater 1004 was changed by elevating the input voltage while detecting the substrate temperature, until it was stabilized constantly at 250° C.

Then, the auxiliary valve 1029 and the outflow valve 1028 were opened fully to effect degassing sufficiently in the flowmeter 1041 to vacuum. After closing the auxiliary valve 1029 and the outflow valve 1028, the valve 1014 of the bomb 1009 containing SiH₄ gas (purity: 99.999%) diluted with H₂ to 10 vol. % [hereinafter referred to as SiH$_4$(10)/H$_2$]and the valve 1016 of the bomb 1011 containing B$_2$H$_6$ gas diluted with H$_2$ to 500 vol. ppm [hereinafter referred to as B$_2$H$_6$(500)/H$_2$] were respectively opened to adjust the pressure at the outlet pressure gages 1032 and 1034 respectively, to 1 kg/cm², whereupon the inflow valves 1019, 1021 were gradually opened to permit SiH$_4$(10)/H$_2$ gas and B$_2$H$_6$(500)/H$_2$ gas to flow into the flowmeters 1037 and 1039, respectively. Subsequently, the outflow valves 1024 and 1026 were gradually opened, followed by opening of the auxiliary valve 1029. The inflow valves 1019 and 1021 were adjusted thereby so that the gas feed ratio of SiH$_4$(10)/H$_2$ to B$_2$H$_6$(500)/H$_2$ was 1:2. Then, while carefully reading the Pirani gage 1042, the opening of the auxiliary valve 1029 was adjusted and it was opened to the extent until the inner pressure in the chamber 1001 became $1 \times 10^{-2}$ Torr. After the inner pressure in the chamber 1001 was stabilized, the main valve 1031 was gradually closed to narrow its opening until the indication on the Pirani gage 1042 became 0.5 Torr. After confirming that the gas feeding and the inner pressure were stabilized, the shutter 1008 was closed and then the switch of high frequency power source 1043 was turned on to input a high frequency power of 13.56 MHz between the electrodes 1003 and 1008, thereby generating glow discharge in the chamber 1001 to provide an input power of 10 W. After glow discharging was continued for 40 minutes to form a charge generation layer to a layer thickness of about 1μ, the high frequency power source 1043 was turned off for intermission of glow discharging and the valve 1031 was fully opened.

As the next step, the valves 1019, 1021 were adjusted so that the gas feed ratio of $SiH_4(10)/H_2$ to $B_2H_6(500)/H_2$ may be 500:1, and the inner pressure in the chamber 1001 was maintained at $1 \times 10^{-2}$ Torr by adjusting the opening of the auxiliary valve 1029. After the inner pressure in the chamber 1001 was stabilized, the main valve 1031 was gradually closed to narrow its opening until the indication on the Pirani gage 1042 became 0.2 Torr. After confirming that the gas inflow and the inner pressure were stabilized, the high frequency power source 1043 was turned on to input a high frequency power source between the electrodes 1003 and 1008, thereby generating glow discharge at an input power of 10 W in the chamber 1001. Glow discharging was continued to be maintained under these conditions for about 10 hours to form a charge transport layer. Thereafter, the heater 1004 was turned off, with the high frequency source 1043 being also turned off, and the substrate was left to cool to 100° C., whereupon the outflow valves 1024, 1026 and the inflow valves 1019, 1021 were closed, with the main valve 1031 fully opened, thereby to make the inner pressure in the chamber 1001 to less than $10^{-5}$ Torr. Then, the main valve 1031 was closed and the inner pressure in the chamber 1001 was made atmospheric through the leak valve 1030, and the substrate was taken out.

The entire thickness of the layers thus formed on the substrate was about 15μ.

The thus prepared photoconductive member was placed in an experimental device for charging and exposure to light. Corona charging was effected at ⊕6.0 KV, and light exposure by scanning of a semiconductor laser at 780 nm to which image signals had been given at a light quantity of 5 μJ.

Immediately thereafter, negatively (⊖) charged developers (containing toner and carrier) were cascaded on the surface of the photoconductive member to obtain a good toner image on the photoconductive member. When the toner image on the photoconductive member was transferred on a transfer paper by corona charging at ⊕5.0 KV, there was obtained a clear image of high density which was excellent in resolution as well as in gradation reproducibility. The above image characteristics were not lowered after image formation had been repeated for 50,000 times.

In the bomb 1010, there was sealed $SiF_4$ gas containing 10 vol. % of $H_2$ (hereinafter referred to as $SiF_4/H_2(10)$ and in the bomb 1017 was sealed $N_2$. These gases are a part of the gas species to be employed in the following Examples.

EXAMPLE 2

Various photoconductive members were prepared under the same conditions and according to the same procedures as in Example 1 except that, in formation of the charge generation layer the content of boron(B) in said layer was changed variously by changing the feed ratio of $SiH_4(10)/H_2$ to $B_2H_6(500)/H_2$. Also, the same procedures were repeated under the same conditions as in Example 1 except that, in formation of the charge generation layer, the layer thickness of the charge generation layer was changed variously by changing the glow discharge time to prepare various photoconductive members. In either of these cases, each sample was placed in the same charging-exposure device as in Example 1 to perform image formation thereon. The image quality of each sample was judged to obtain the results as shown in Table 7 below.

TABLE 1

| Sample No. | Layer thickness | B content (atomic %) | | | | | |
|---|---|---|---|---|---|---|---|
| | | $10^{-3}$ | $10^{-2}$ | $10^{-1}$ | 1 | 10 | 20 |
| 2-1 | 0.1 | X | X | X | X | X | X |
| | | | | | | | X |
| 2-2 | 0.3 | X | △ | △ | ⊙ | ○ | |
| 2-3 | 0.5 | X | △ | ○ | ⊙ | ⊙ | |
| 2-4 | 1 | X | △ | ○ | ⊙ | ○ | |
| 2-5 | 2 | X | ○ | ⊙ | ⊙ | △ | |
| 2-6 | 5 | △ | △ | ○ | ○ | △ | |
| 2-7 | 10 | X | X | X | X | X | X |

⊙: Excellent
○: Good
△: Practically satisfactorily usable
X: Practically not usable

EXAMPLE 3

After the same procedure was conducted under the same conditions as in Example 1 up to the step of formation of the charge generation layer a second barrier layer was formed, without leak of the vacuum system, under the same conditions as in formation of the first barrier layer in Example 1 except that the discharge time was changed to 30 seconds. Then, the procedure was repeated again under the same conditions as in Example 1 up to the step of formation of the charge transport layer to prepare the photoconductive member having the layer structure as shown in FIG. 2. This sample was placed in the same charging-exposure device as used in Example 1 to effect image formation thereon. The image quality was judged to find that high quality transferred toner image was obtained, indicating good results.

EXAMPLE 4

After the same procedure as in Example 1 was conducted under the same conditions up to the step to form the charge transport layer, a surface barrier layer as formed, without leak of the vacuum system, under the same conditions as in formation of the first barrier as in Example 1 to obtain a photoconductive member having the layer structure as shown in FIG. 3. This sample was placed in the same charging-exposure device as used in Example 1 to effect image formation thereon, of which image quality was judged to be further improved in image quality as compared with that of Example 1.

EXAMPLE 5

After the same procedure as in Example 3 was conducted under the same conditions up to the step for formation of the charge transport layer, a surface barrier layer was formed, without leak of the vacuum system, under the same conditions as in formation of the first barrier layer as in Example 1 to obtain a photoconductive member having the layer structure as shown in FIG. 4. This sample was placed in the same charging-exposure device as used in Example 1 to effect image formation thereon. There was obtained an image which was judged to have an image quality further higher in contrast than that obtained in Example 3.

EXAMPLE 6

A photoconductive member was prepared under the same conditions as in Example 4 except that in the step of formation of the charge generation layer $PH_3$ gas diluted to 500 vol. ppm with $H_2$ [hereinafter referred to as $PH_3(500)/H_2$] was used in place of $B_2H_6(500)/H_2$ gas. The layer structure in this case was as shown in FIG. 3, having a first barrier layer, a $n^+$-type charge generating layer, an i-type charge transport layer and a surface barrier layer which were layered in the order mentioned from the side of the substrate. The thus prepared photoconductive member was placed in the same charging-exposure device as used in Example 1. Image formation was effected by corona charging at $\ominus 5.5$ KV and image exposure by scanning of a semiconductor laser at 780 nm to which image signals had been given at a light quantity of 10 μJ. Immediately after image exposure, a toner image was obtained on the surface of the photoconductive member by cascading $\oplus$ charged developer on the surface of the photoconductive member. The toner image on the photoconductive member was transferred to a transfer paper by $\ominus 5.2$ KV corona charging to give a good transferred image on the transfer paper.

EXAMPLE 7

Based on the layer structure as shown in FIG. 4, various examples were prepared as shown in Tables 2 to 5 by changing the conditions for preparations of the first barrier layer, the second barrier layer and the surface barrier layer. In examples set forth herein, the charge generation layer and the charge transport layer were the same as described in Example 1.

TABLE 2

| Sample No. | | Starting gas or Target | Feed gas (or area) ratio | Preparation method | Power (W) | Layer thickness (Å) |
|---|---|---|---|---|---|---|
| 7-1 | First barrier layer | Polycrystalline Si target, | Si:C = 1:9 | Sputter | 100 | 200 |
| | Second barrier layer | | | | 100 | 100 |
| | Surface barrier layer | Graphite target, Ar | | | 200 | 2000 |
| 7-2 | First barrier layer | $SiH_4$ (diluted to 10 vol. % with $H_2$) | $SiH_4(10)/H_2$: $C_2H_4(10)/H_2 = 1:9$ | Glow | 3 | 120 |
| | Second barrier layer | | | | 3 | 100 |
| | Surface barrier layer | $C_2H_4$ (diluted to 10 vol. % with $H_2$) | | | 10 | 600 |
| 7-3 | First barrier layer | Polycrystalline Si target, | — | Sputter | 200 | 120 |
| | (None) | | | | — | — |
| | Second barrier layer | Graphite target, | | | | |
| | Surface barrier layer | $SiF_4$ ($H_2$ content: 10 vol. %) | | | 200 | 120 |
| 7-4 | First barrier layer | $SiF_4$ ($H_2$ content: 10 vol. %) | $SiF_4/H_2(10)$: $C_2H_4(10)/H_2 = 1:9$ | Glow | 10 | 120 |
| | Second barrier layer | | | | 10 | 80 |
| | Surface barrier layer | $C_2H_4$ (diluted to 10 vol. % with $H_2$) | | | 10 | 120 |

TABLE 3

| Sample No. | | Starting gas or Target | Feed gas (or area) ratio | Preparation method | Power (W) | Layer thickness (Å) |
|---|---|---|---|---|---|---|
| 7-5 | First barrier layer | Polycrystalline Si target, | — | Sputter | 100 | 500 |
| | Second barrier layer | | | | 50 | 100 |
| | Surface barrier layer | $N_2$ (diluted to 50 vol. % with Ar) | | | 200 | 5000 |
| 7-6 | First barrier layer | $SiH_4$ (diluted to 10 vol. % with $H_2$), | $SiH_4(10)/H_2:N_2 = 1:10$ | Glow | 3 | 200 |
| | Second barrier layer (None) | $N_2$ | | | — | — |
| | Surface barrier layer | | | | 3 | 500 |
| 7-7 | First barrier layer | Polycrystalline Si target, | $SiF_4/H_2(10):N_2 = 1:10$ | Sputter | 200 | 120 |
| | Second barrier layer | | | | 200 | 80 |
| | Surface barrier layer | $SiF_4$ ($H_2$ content: 10 vol. %), $N_2$, Ar | | | 200 | 120 |
| 7-8 | First barrier layer | $SiF_4$ ($H_2$ content: 10 vol. %), | $SiF_4/H_2(10):N_2 = 1:50$ | Glow | 10 | 300 |
| | Second barrier layer | | | | 10 | 80 |
| | Surface barrier layer | $N_2, H_2$ | | | 10 | 300 |

TABLE 4

| Sample No. | | Starting gas or Target | Feed gas (or area) ratio | Preparation method | Power (W) | Layer thickness (Å) |
|---|---|---|---|---|---|---|
| 7-9 | First barrier layer | Polycrystalline Si target, | — | Sputter | 100 | 400 |
| | Second barrier layer (None) | $O_2$ (diluted to 50 vol. % with Ar) | | | — | — |
| | Surface barrier layer | | | | 200 | 6000 |
| 7-10 | First barrier layer | $SiH_4$ (diluted to 10 vol. % with $H_2$), | $SiH_4(10)/H_2:O_2 = 10:1$ | Glow | 3 | 400 |
| | Second barrier layer | | | | 3 | 80 |
| | Surface barrier layer | $O_2$ | | | 3 | 500 |
| 7-11 | First barrier layer | Polycrystalline Si | $SiF_4/H_2(10):O_2 =$ | Sputter | 200 | 120 |

TABLE 4-continued

| Sample No. | Starting gas or Target | Feed gas (or area) ratio | Preparation method | Power (W) | Layer thickness (Å) |
|---|---|---|---|---|---|
| Second barrier layer | target, | 1:10 | | 200 | 80 |
| Surface barrier layer | SiF$_4$ (H$_2$ content: 10 vol. %) O$_2$, Ar | | | 200 | 120 |
| 7-12 First barrier layer | SiF$_4$ (H$_2$ content: 10 vol. %) | SiF$_4$/H$_2$(10):O$_2$ = 1:1 | Glow | 10 | 100 |
| Second barrier layer (None) | SiH$_4$, Ar, O$_2$ | | | — | — |
| Surface barrier layer | | | | 20 | 200 |

TABLE 5

| Sample No. | Starting gas or Target | Feed gas (or area) ratio | Preparation method | Power (W) | Layer thickness (Å) |
|---|---|---|---|---|---|
| 7-13 First barrier layer | Al$_2$O$_3$ target | — | Sputter | 100 | 500 |
| Second barrier layer | Ar | | | 100 | 100 |
| Surface barrier layer | | | | 100 | 500 |

EXAMPLE 8

Using a device as shown in FIG. 10 placed in a clean room which had been completely sealed, an image forming member for electrophotography was prepared according to the following procedures.

A substrate of molybdenum 1002 of 10 cm square having a thickness of 0.5 mm, whose surface had been cleaned, was fixed firmly on a supporting member 1003 disposed at a predetermined position in a glow discharging deposition chamber 1001. The targets 1005, 1006 were made of a high purity polycrystalline silicon (99.999%) placed on a high purity graphite (99.999%). These targets were covered with a shutter 1008. The substrate 1002 was heated by a heater 1004 within the supporting member 1003 with a precision of ±0.5° C. The temperature was measured directly at the backside of the substrate by an alumel-chromel thermocouple. Then, after confirming that all the valves in the system were closed, the main valve 1031 was opened fully to evacuate the chamber once to $5 \times 10^{-7}$ Torr (during the operation all the valves in the system were closed) and the auxiliary valve 1029 and the outflow valves 1024, 1025, 1026, 1027, 1028 were opened to remove sufficiently the gases in the flowmeters 1037, 1038, 1039, 1040, 1041. Then, the auxiliary valve 1029 and the outflow valves 1024, 1025, 1026, 1027, 1028, were closed. Then, the heater 1004 was turned on and the input voltage was elevated and changed, while detecting the substrate temperature, until it was stabilized constantly at 250° C.

Subsequently, the valve 1014 of the SiH$_4$(10)/H$_2$ gas bomb 1009 and the valve 1016 of the B$_2$H$_6$(500)/H$_2$ gas bomb 1011 were opened until the pressures at the outlet pressure gages 1032, 1034 were adjusted to 1 kg/cm$^2$, and then the inflow valves 1019, 1021 were gradually opened thereby to permit SiH$_4$(10)/H$_2$ gas and B$_2$H$_6$(500)/H$_2$ gas to flow into the flowmeters 1037, 1039, respectively, followed by gradual opening of the auxiliary valve 1029. The inflow valves 1019 and 1021 were thereby adjusted so that the feed gas ratio of SiH$_4$(10)/H$_2$ to B$_2$H$_6$(500)/H$_2$ were 500:1. Subsequently, opening of the auxiliary valve 1029 was adjusted while reading carefully indication on the Pirani gage 1042 until the inner pressure in the chamber 1001 became $1 \times 10^{-2}$ Torr. After the inner pressure in the chamber 1001 was stabilized, the main valve 1031 was gradually closed to narrow the opening until the indication on the Pirani gage 1042 became 0.5 Torr. After confirming that the gas inflow and the inner pressure were stabilized, with the shutter 1008 being closed, the switch of the high frequency power source 1043 was turned on the input a high frequency power of 13.56 MHz, between the electrodes 1003 and 1008 to generate glow discharge in the chamber 1001 to provide an input power of 10 W. Glow discharge was continued for 10 hours to form a charge transport layer of a layer thickness of about 15μ.

Then, the high frequency power source 1043 was turned off for intermission of glow discharging, and the valve 1031 was once fully opened. Then, the valves 1019 and 1021 were adjusted so that the gas feed ratio of SiH$_4$(10)/H$_2$ to B$_2$H$_6$(500)/H$_2$ became 1:2 and the opening of the auxiliary valve 1029 adjusted to maintain the inner pressure in the chamber 1001 at $1 \times 10^{-2}$ Torr. After the inner pressure in the chamber 1001 was stabilized, the main valve 1031 was gradually closed to narrow its opening until the indication on the Pirani gage 1042 became 0.2 Torr. After confirming that the gas inflow and the inner pressure were stabilized, the switch of the high frequency power source 1043 was turned on to input a high frequency power of 13.56 MHz between the electrodes 1003 and 1008, thereby generating glow discharge in the chamber 1001 at an input power of 10 W. Thus, glow discharging was continued for about 40 minutes to form a charge generation layer with a thickness of about 1μ. After intermission of discharging, the valves 1024, 1026 were closed, with full opening of the valves 1029, 1031, the chamber 1001 was evacuated to $5 \times 10^{-7}$ Torr. The shutter 1008 was opened at this moment. The substrate temperature was controlled to be 150° C. and stabilized thereat. Then, the input voltage at the heater 1004 was lowered, whereupon the valve 1018 of the argon gas bomb 1013 (purity: 99.999%) was opened and adjusted so that the reading on the outlet pressure gage 1036 became 1 kg/cm$^2$. Then, the inflow valve 1023 was gradually opened, followed by gradual opening of the outflow valve 1028, to permit argon gas to flow into the chamber 1001. The outflow valve 1028 was gradually opened until the indication on the Pirani gage 1042 became $5 \times 10^{-4}$ Torr. After the flow amount had been stabilized under this state, the main valve 1031 was gradually closed to narrow its opening until the inner pressure in the chamber became $1\times10^{-2}$ Torr. With the shutter 1008 opened, the flowmeter 1041 was confirmed to be stabilized, and thereafter the high frequency power 1043 was turned on to input an alternate power of 13.56 MHz and 100 W between the targets 1005, 1006 and the supporting member 1003. A layer was formed while taking matching so as to continue stable discharging under these conditions. Thus, discharging was continued for about 10 minutes to form a surface barrier layer with a thickness of 900 Å.

The heater 1004 was turned off, with the high frequency power source 1043 being also turned off, and the substrate was left to cool to 100° C., whereupon the outflow valves 1024, 1026 and the inflow valves 1019, 1021 were closed, with the main valve 1031 fully opened, thereby to make the inner pressure in the chamber 1001 to less than $10^{-5}$ Torr. Then, the main valve 1031 was closed and the inner pressure in the chamber 1001 was made atmospheric through the leak valve 1030, and the substrate was taken out.

The thus prepared photoconductive member was placed in an experimental device for charging and exposure to light, and corona charging was effected at $\ominus 5.5$ KV, followed immediately by exposure to light by scanning of a semiconductor laser at 780 nm to which image signals had been given, at a light quantity of 5 μJ.

Immediately thereafter ⊕ charged developers (containing toner and carrier) were cascaded on the surface of the photosensitive member to obtain a good toner image on the photoconductive member. When the toner image on the image forming member for electrophotography was transferred onto a transfer paper by corona charging at $\ominus 5.0$ KV, there was obtained a clear image of high density which was excellent in resolution as well as in gradation reproducibility. The above image characteristics were not lowered even after the image formation had been repeated for 50,000 times.

EXAMPLE 9

Various photoconductive members were prepared under the same conditions and according to the same procedures as in Example 8 except that, in formation of the charge generation layer, the content of boron(B) in said layer was changed variously by changing the feed ratio of $SiH_4(10)/H_2$ to $B_2H_6(500)/H_2$. Also, the same procedures were repeated under the same conditions as in Example 8 except that, in formation of the charge generation layer, the layer thickness of the charge generation layer was changed variously by changing the glow discharge time to prepare various photoconductive members. In either of these cases, each sample was placed in the same charging-exposure device as used in Example 8 to effect image formation thereon. The image quality of each sample was judged to obtain the results as shown in Table 6 below.

TABLE 6

| Sample No. | Layer thickness | B content (atomic %) | | | | | |
|---|---|---|---|---|---|---|---|
| | | $10^{-3}$ | $10^{-2}$ | $10^{-1}$ | 1 | 10 | 20 |
| 9-1 | 0.1 | X | X | X | X | X | X |
| 9-2 | 0.3 | X | Δ | Δ | ⊙ | ⊙ | X |
| 9-3 | 0.5 | X | Δ | ⊙ | ⊙ | ⊙ | |
| 9-4 | 1 | X | Δ | ⊙ | ⊙ | ○ | |
| 9-5 | 2 | X | ⊙ | ⊙ | ⊙ | Δ | |
| 9-6 | 5 | Δ | Δ | ⊙ | ⊙ | Δ | |
| 9-7 | 10 | X | X | X | X | X | X |

⊙: Excellent
○: Good
Δ: Practically satisfactorily usable
X: Practically not usable

EXAMPLE 10

Under the same conditions as in Example 8, except for further providing a lower barrier layer at the interface between the support and the charge transport layer, there was prepared a photoconductive member (with the layer structure as shown in FIG. 9). The lower barrier layer was formed under the same conditions as in formation of the surface barrier layer in Example 8 except that the glow discharge was continued for 5 minutes. The thickness of the layer was about 500 Å. Using this photoconductive member, an image was formed by means of the same charging-exposure device as used in Example 8, whereby the resultant image was further improved in image quality with higher contrast than that of Example 8.

EXAMPLE 11

Under the same conditions as in Example 10, except for using $PH_3$ gas diluted to 500 vol. ppm with $H_2$ [hereinafter referred to as $PH_3(500)/H_2$] in place of $B_2H_6(500)/H_2$ gas, a photoconductive member was prepared. The layer constitution was as shown in FIG. 9.

The thus prepared photoconductive member was placed in the same charging-exposure device as in Example 8. Image formation was effected by corona charging at ⊕6 KV and light exposure by a semiconductor laser at 780 nm, to which image signals had been given, at a light quantity of 10 μJ. Immediately after the light exposure, ⊖ charged developer was cascaded on the surface of the photoconductive member to obtain the toner image on the photoconductive member, which was in turn transferred onto a transfer paper by corona charging at ⊕ 5.5 KV to give a good transferred image.

EXAMPLE 12

Based on the layer structure as shown in FIG. 9, there are shown examples in Tables 7 to 10 in which the conditions for preparation of the surface barrier layer and the lower barrier layer were varied. In these examples, the charge generation layer and the charge transport layer were the same as mentioned in Example 8.

TABLE 7

| Sample No. | | Starting gas or Target | Feed gas (or area) ratio | Preparation method | Power (W) | Layer thickness (Å) |
|---|---|---|---|---|---|---|
| 12-1 | Lower barrier layer | Polycrystalline Si target, Graphite target, Ar | Si:C = 1:9 | Sputter | 100 | 200 |
| | Surface barrier layer | | | | 200 | 2000 |
| 12-2 | Lower barrier layer | $SiH_4$ (diluted to 10 | $SiH_4(10)/H_2$: | Glow | 3 | 120 |

TABLE 7-continued

| Sample No. | | Starting gas or Target | Feed gas (or area) ratio | Preparation method | Power (W) | Layer thickness (Å) |
|---|---|---|---|---|---|---|
| | Surface barrier layer | vol. % with H$_2$) C$_2$H$_4$ (diluted to 10 vol. % with H$_2$) | C$_2$H$_4$(10)/H$_2$ = 1:9 | | 10 | 600 |
| 12-3 | Lower-barrier layer | Polycrystalline | — | Sputter | 200 | 120 |
| | Surface barrier layer | Si target, Graphite target, SiF$_4$ (H$_2$ content: 10 vol. %) | | | 200 | 120 |
| 12-4 | Lower barrier layer | SiF$_4$ (H$_2$ content: 10 vol. %) | SiF$_4$/H$_2$(10)/: C$_2$H$_4$(10)/H$_2$ = 1:9 | Glow | 10 | 120 |
| | Surface barrier layer | C$_2$H$_4$ (diluted to 10 vol. % with H$_2$) | | | 10 | 120 |

TABLE 8

| Sample No. | | Starting gas or Target | Feed gas (or area) ratio | Preparation method | Power (W) | Layer thickness (Å) |
|---|---|---|---|---|---|---|
| 12-5 | Lower barrier layer | Polycrystalline | — | Sputter | 100 | 500 |
| | Surface barrier layer | Si target, N$_2$ (diluted to 50 vol. % with Ar) | | | 200 | 5000 |
| 12-6 | Lower barrier layer | SiH$_4$ (diluted to 10 vol. % with H$_2$), N$_2$ | SiH$_4$(10)/H$_2$: N$_2$ = 1:10 | Glow | 3 | 200 |
| | Surface barrier layer | | | | 3 | 500 |
| 12-7 | Lower barrier layer | Polycrystalline Si target, SiF$_4$ (H$_2$ content: 10 vol. %), N$_2$, Ar | SiF$_4$/H$_2$(10): N$_2$ = 1:10 | Sputter | 200 | 120 |
| | Surface barrier layer | | | | 200 | 120 |
| 12-8 | Lower barrier layer | SiF$_4$ (H$_2$ content: 10 vol %) N$_2$, H$_2$ | SiF$_4$/H$_2$(10): N$_2$ = 1:50 | Glow | 10 | 300 |
| | Surface barrier layer | | | | 10 | 300 |

TABLE 9

| Sample No. | | Starting gas or Target | Feed gas (or area) ratio | Preparation method | Power (W) | Layer thickness (Å) |
|---|---|---|---|---|---|---|
| 12-9 | Lower barrier layer | Polycrystalline Si target, O$_2$ (diluted to 50 vol. % with Ar) | — | Sputter | 100 | 400 |
| | Surface barrier layer | | | | 200 | 6000 |
| 12-10 | Lower barrier layer | SiH$_4$ (diluted to 10 vol. % with H$_2$), O$_2$ | SiH$_4$(10)/H$_2$: O$_2$ = 10:1 | Glow | 3 | 400 |
| | Surface barrier layer | | | | 3 | 500 |
| 12-11 | Lower barrier layer | Polycrystalline Si target, SiF$_4$ (H$_2$ content: 10 vol. %) O$_2$, Ar | SiF$_4$/H$_2$(10): O$_2$ = 1:10 | Sputter | 200 | 120 |
| | Surface barrier layer | | | | 200 | 120 |

TABLE 10

| Sample No. | | Starting gas or Target | Feed gas (or area) ratio | Preparation method | Power (W) | Layer thickness (Å) |
|---|---|---|---|---|---|---|
| 12-12 | Lower barrier layer | SiF$_4$ (H$_2$ content: 10 vol. %), SiH$_4$, Ar, O$_2$ | SiF$_4$/H$_2$(10): O$_2$ = 1:1 | Glow | 10 | 100 |
| | Surface barrier layer | | | | 20 | 200 |
| 12-13 | Lower barrier layer | Al$_2$O$_3$ | — | Sputter | 100 | 500 |
| | Surface barrier layer | Ar | | | 100 | 500 |

What we claim is:

1. A photoconductive member, comprising a support for a photoconductive member;

a charge generation layer which generates photocarriers movable by irradiation of an electromagnetic wave;

a charge transport layer which is disposed in relation to said charge generation layer so as to permit efficient injection of photocarriers generated in said charge generation layer into the charge transport layer and is provided with the function to transport effectively said injected photocarriers; and a first barrier layer interposed between said support and said charge generation layer;

said charge generation layer and said charge transport layer each comprising an amorphous material containing at least one of hydrogen and halogen atoms in a matrix of silicon atoms, and said charge generation layer containing at least one of a donor and acceptor impurity to control the conduction of said charge generation layer, said impurity present in an amount of $1 \times 10^{-1}$ to 10 atomic %, wherein said member is subject to generation of free carriers.

2. A photoconductive member according to claim 1, wherein the first barrier layer is provided with the functions to bar injection of at least one of free carriers moving in the direction from the support to the charge generation layer or moving from the charge generation layer to the support and, at the time of irradiation by an electromagnetic wave, to permit passage of the photocarriers of one conduction type migrating toward the support among the photocarriers of the opposite conduction type generated in said charge generation layer during said irradiation by said electromagnetic wave.

3. A photoconductive member according to claim 1, wherein the first barrier layer comprises an amorphous material containing at least one kind of atoms selected from the group consisting of carbon atoms, nitrogen atoms and oxygen atoms in a matrix of silicon atoms.

4. A photoconductive member according to claim 3, wherein the first barrier layer contains at least one of hydrogen atoms and halogen atoms.

5. A photoconductive member according to claim 1, wherein the first barrier layer is constituted of an electrically insulating metal oxide.

6. A photoconductive member according to claim 1, further comprising a second barrier layer which is interposed between the charge generation layer and the charge transport layer and existing above the the first barrier layer, said second barrier layer being provided with the function to bar injection of free carriers present in said charge generation layer into said charge transport layer.

7. A photoconductive member according to claim 6, further comprising a surface barrier layer comprising an amorphous material containing at least one kind of atoms selected from the group consisting of carbon atoms, nitrogen atoms and oxygen atoms in a matrix of silicon atoms, on an upper surface of said member.

8. A photoconductive member according to claim 6, further comprising a surface barrier layer constituted of an electrically insulating metal oxide on an upper surface of said member.

9. A photoconductive member according to claim 7 or claim 8, wherein the surface barrier layer has a layer thickness of 30 Å to 5μ.

10. A photoconductive member according to claim 7 or claim 8, wherein the surface barrier layer is provided in contact with the charge transport layer.

11. A photoconductive member according to claim 7 or claim 8, wherein the surface barrier layer is provided in contact with the charge generation layer.

12. A photoconductive member according to claim 6, wherein the second barrier layer has a layer thickness of 10 to 1000 Å.

13. A photoconductive member according to claim 1, wherein the first barrier layer is provided in contact with the support.

14. A photoconductive member according to claim 1 or claim 13, wherein the first barrier layer has a layer thickness of 30 to 1000 Å.

15. A photoconductive member according to claim 6, wherein the charge generation layer is interposed directly between the first barrier layer and the second barrier layer.

16. A photoconductive member according to claim 15, wherein there is further provided another charge transport layer spaced beneath the first barrier layer and above the support.

17. A photoconductive member according to claim 16, wherein said another charge transport layer, the first barrier layer, the charge generation layer, the second barrier layer and the charge transport layer are layered in the order mentioned on the support.

18. A photoconductive member according to claim 6, wherein the charge transport layer is interposed directly between the first barrier layer and the second barrier layer.

19. A photoconductive member according to claim 18, wherein the second barrier layer has a layer thickness of 10 to 1000 Å.

20. A photoconductive member according to claim 18, further comprising a surface barrier layer comprising an amorphous material containing at least one kind of atoms selected from the group consisting of carbon atoms, nitrogen atoms and oxygen atoms in a matrix of silicon atoms on an upper surface of said member.

21. A photoconductive member according to claim 18, further comprising a surface barrier layer constituted of an electrically insulating metal oxide on an upper surface of said member.

22. A photoconductive member according to claim 20 or claim 21, wherein the surface barrier layer has a layer thickness of 30 Å to 5μ.

23. A photoconductive member according to claim 18, claim 20 or claim 21, wherein the first barrier layer is provided in contact with the support.

24. A photoconductive member according to claim 23, wherein the first barrier layer has a layer thickness of 30 to 1000 Å.

25. A photoconductive member according to claim 20 or claim 21, wherein the first barrier layer, the charge transport layer, the second barrier layer, the charge generation layer and the surface barrier layer are layered in the order mentioned on the support.

26. A photoconductive member according to claim 15, further comprising a surface barrier layer comprising an amorphous material containing at least one kind of atoms selected from the group consisting of carbon atoms, nitrogen atoms and oxygen atoms in a matrix of silicon atoms on an upper surface of said member.

27. A photoconductive member according to claim 15, further comprising a surface barrier layer comprising an electrically insulating metal oxide on the surface.

28. A photoconductive member according to claim 26 or claim 27, wherein the surface barrier layer has a layer thickness of 30 Å to 5μ.

29. A photoconductive member according to claim 26 or claim 27, wherein the first barrier layer, the charge generation layer, the second barrier layer, the charge transport layer, and the surface barrier layer are layered in the order mentioned on the support.

30. A photoconductive member according to claim 15, wherein the first barrier layer, the charge generation layer, the second barrier layer and the charge transport layer are layered in the order mentioned on the support.

31. A photoconductive member according to claim 7 or claim 20, wherein the surface barrier layer contains at least one of hydrogen atoms and halogen atoms.

32. A photoconductive member according to claim 6, wherein the second barrier layer comprises an amorphous material containing at least one kind of atoms selected from the group consisting of carbon atoms, nitrogen atoms and oxygen atoms in a matrix of silicon atoms.

33. A photoconductive member according to claim 32, wherein the second barrier layer contains at least one of hydrogen atoms and halogen atoms.

34. A photoconductive member according to claim 6, wherein the second barrier layer is constituted of an electrically insulating metal oxide.

35. A photoconductive member according to claim 1, claim 2, claim 3 or claim 4, further comprising a second barrier layer provided with the function to bar injection of free carriers in said charge generation layer moving in the direction of said charge transport layer, said second barrier layer spaced above the charge generation layer and the charge transport layer.

36. A photoconductive member according to claim 35, wherein the second barrier layer comprises an amorphous material containing at least one kind of atoms selected from the group consisting of carbon atoms, nitrogen atoms and oxygen atoms in a matrix of silicon atom.

37. A photoconductive member according to claim 36, wherein the second barrier layer contains at least one of hydrogen atoms and halogen atoms.

38. A photoconductive member according to claim 35, wherein the second barrier layer is constituted of an electrically insulating metal oxide.

39. A photoconductive member according to claim 35, wherein the charge generation layer and the charge transport layer are interposed between the first barrier layer and the second barrier layer.

40. A photoconductive member according to claim 39, wherein the first barrier layer is provided in contact with the support.

41. A photoconductive member according to claim 40, wherein the first barrier layer has a layer thickness of 30 to 1000 Å.

42. A photoconductive member according to claim 40, wherein the first barrier layer, the charge generation layer, the charge transport layer and the second barrier layer are layered in the order mentioned on the support.

43. A photoconductive member according to claim 34, wherein the first barrier layer is interposed between the charge generation layer and the charge transport layer.

44. A photoconductive member according to claim 43, wherein the first barrier layer has a layer thickness of 10 to 1000 Å.

45. A photoconductive member according to claim 34, wherein the charge generation layer is interposed directly between the first barrier layer and the second barrier layer.

46. A photoconductive member according to claim 45, wherein the second barrier layer is provided on an upper surface of said charge generation layer.

47. A photoconductive member according to claim 46, wherein the second barrier layer has a layer thickness of 30 Å to 5μ.

48. A photoconductive member according to claim 1, claim 2, claim 3 or claim 4, wherein the charge transport layer is interposed between the first barrier layer and the charge generation layer.

49. A photoconductive member according to claim 48, wherein the first barrier layer is provided in contact with the support.

50. A photoconductive member according to claim 49, wherein the first barrier layer has a layer thickness of 30 to 1000 Å.

51. A photoconductive member according to claim 49, wherein the first barrier layer, the charge transport layer and the charge generation layer are layered in the order mentioned on the support.

52. A photoconductive member according to claim 1, claim 2, claim 3 or claim 4, wherein the first barrier layer is interposed between the charge generation layer and the charge transport layer.

53. A photoconductive member according to claim 52, wherein the first barrier layer is provided in contact with the charge generation layer.

54. A photoconductive member according to claim 52, wherein the first barrier layer has a layer thickness of 10 to 1000 Å.

55. A photoconductive member according to claim 1, wherein the charge transport layer exhibits i-type semiconductor characteristics.

56. A photoconductive member according to claim 1, wherein the charge generation layer exhibits $p^+$-type semiconductor characteristics.

57. A photoconductive member according to claim 1, wherein the charge generation layer exhibits $n^+$-type semiconductor characteristics.

58. A photoconductive member according to claim 1, wherein the charge transport layer exhibits semiconductor characteristics selected from $n^-$-type, n-type and i-type, when the charge generation layer exhibits $p^+$-type semiconductor characteristics.

59. A photoconductive member according to claim 1, wherein the charge transport layer exhibits semiconductor characteristics selected from $p^-$-type, p-type and i-type, when the charge generation layer exhibits $n^+$-type semiconductor characteristics.

60. A photoconductive member according to claim 1, wherein the charge generation layer has a layer thickness of 0.3 to 5μ.

61. A photoconductive member according to claim 1, wherein the charge transport layer has a layer thickness of 3 to 100μ.

62. A photoconductive member, comprising a support for a photoconductive member;
a surface barrier layer provided with the function to bar injection of surface charges from a free surface of said surface barrier layer facing said support and which is layered on said support;
a charge generation layer for generation of photocarriers movable by irradiation of an electromagnetic wave, which is provided in contact with said barrier layer; and
a charge transport layer which is provided in contact with said charge generation layer so that the photocarriers generated in said generation layer may efficiently be injected into the charge transport layer, said charge generation layer and said charge transport layer each comprising of an amorphous material containing at least one of hydrogen and halogen atoms in a matrix of silicon atoms, and said charge generation layer containing at least one of a donor and acceptor impurity to control the conduction characteristics of said charge generation layer in an amount of $1 \times 10^{-1}$ to 10 atomic % and wherein said member is subject to formation of free carriers therein.

63. A photoconductive member according to claim 62, further comprising a lower barrier layer which is directly interposed between the support and the charge transport layer.

64. A photoconductive member according to claim 63, wherein the lower barrier layer is provided with the function to bar injection of free carriers moving from the support to the charge generation layer and, at the time of irradiation by an electromagnetic wave, to permit passage of photocarriers of one conduction type generated in said charge generation layer and migrating in the direction of said support, among the photocarriers of the opposite conduction type generated in said charge generation layer by irradiation of said electromagnetic wave.

65. A photoconductive member according to claim 63, wherein the surface barrier layer comprises an amorphous material containing at least one kind of atoms selected from the group consisting of carbon atoms, nitrogen atoms and oxygen atoms in a matrix of silicon atoms.

66. A photoconductive member according to claim 65, wherein the surface barrier layer contains at least one of hydrogen atoms and halogen atoms.

67. A photoconductive member according to claim 63, wherein the surface barrier layer is constituted of an electrically insulating metal oxide.

68. A photoconductive member according to claim 62, claim 63, claim 64 or claim 67, wherein the surface barrier layer has a layer thickness of 30 Å to 5μ.

69. A photoconductive member according to claim 64, wherein the lower barrier layer comprises an amorphous material containing at least one kind of atoms selected from the group consisting of carbon atoms, nitrogen atoms and oxygen atoms in a matrix of silicon atoms.

70. A photoconductive member according to claim 69, wherein the lower barrier layer contains at least one of hydrogen atoms and halogen atoms.

71. A photoconductive member according to claim 63, wherein the lower barrier layer is constituted of an electrically insulating metal oxide.

72. A photoconductive member according to claim 63, wherein the lower barrier layer has a layer thickness of 30 to 1000 Å.

73. A photoconductive member according to claim 62, wherein the charge transport layer exhibits the i-type semiconductor characteristics.

74. A photoconductive member according to claim 62, wherein the charge generation layer exhibits the $p^+$-type semiconductor characteristics.

75. A photoconductive member according to claim 62, wherein the charge generation layer exhibits the $n^+$-type semiconductor characteristics.

76. A photoconductive member according to claim 62, wherein the charge transport layer exhibits semiconductor characteristics selected from $n^-$-type, n-type and i-type, when the charge generation layer exhibits $p^+$-type semiconductor characteristics.

77. A photoconductive member according to claim 62, wherein the charge transport layer exhibits the semiconductor characteristics selected from $p^-$-type, p-type and i-type, when the charge generation layer exhibits $n^+$-type semiconductor characteristics.

78. A photoconductive member according to claim 62, wherein the charge generation layer has a layer thickness of 0.3 to 5μ.

79. A photoconductive member according to claim 1, wherein the charge transport layer has a layer thickness of 3 to 100μ.

* * * * *

UNITED STATES PATENT AND TRADEMARK OFFICE
CERTIFICATE OF CORRECTION

PATENT NO. : 4,557,987

DATED : December 10, 1985

INVENTOR(S) : Shigeru Shirai, et al.

It is certified that error appears in the above-identified patent and that said Letters Patent is hereby corrected as shown below:

```
Column  1, line 45, before "prior" insert --the--.
Column  4, line 15, "stell" should be --steel--.
Column  9, line 47, after "relatively" insert --easy--.
Column  9, line 47, delete "with".
Column 11, line 65, "can," should be --can--.
Column 13, line 18, "acceptpr" should be --acceptor--.
Column 16, line 36, "photoconductives" should be
                    --photoconductive--.
Column 18, line 68, "showh" should be --shown--.
Column 20, line 29, "valves" should be --valve--.
Column 22, under column headed "20," the quality rating from
                    top to bottom, should be
                    --X,Δ,X,X,X,X,X--.
Column 28, under column headed "20," the quality rating from
                    top to bottom, should be --X,Δ,X,X,X,X,X--.
```

Signed and Sealed this

Eighteenth Day of November, 1986

Attest:

DONALD J. QUIGG

Attesting Officer

Commissioner of Patents and Trademarks